United States Patent
Lee et al.

(10) Patent No.: US 10,861,527 B2
(45) Date of Patent: Dec. 8, 2020

(54) SYSTEMS AND METHODS FOR OPTIMIZING MAGNETIC TORQUE AND PULSE SHAPING FOR REDUCING WRITE ERROR RATE IN MAGNETOELECTRIC RANDOM ACCESS MEMORY

(71) Applicant: Inston, Inc., Santa Monica, CA (US)

(72) Inventors: Albert Lee, Los Angeles, CA (US); Hochul Lee, Los Angeles, CA (US)

(73) Assignee: Inston, Inc., Santa Monica, CA (US)

( * ) Notice: Subject to any disclaimer, the term of this patent is extended or adjusted under 35 U.S.C. 154(b) by 0 days.

(21) Appl. No.: 16/591,293

(22) Filed: Oct. 2, 2019

(65) Prior Publication Data
US 2020/0035282 A1 Jan. 30, 2020

Related U.S. Application Data

(63) Continuation-in-part of application No. 16/020,933, filed on Jun. 27, 2018, now Pat. No. 10,460,786.
(Continued)

(51) Int. Cl.
*G11C 11/22* (2006.01)
*G11C 11/16* (2006.01)
(Continued)

(52) U.S. Cl.
CPC ........ *G11C 11/1675* (2013.01); *G11C 11/161* (2013.01); *G11C 11/1655* (2013.01);
(Continued)

(58) Field of Classification Search
CPC .............. G11C 11/1675; G11C 11/161; G11C 11/1655; G11C 11/1657
(Continued)

(56) References Cited

U.S. PATENT DOCUMENTS

| | | |
|---|---|---|
| 4,038,596 A | 7/1977 | Lee |
| 6,040,996 A | 3/2000 | Kong |

(Continued)

FOREIGN PATENT DOCUMENTS

| | | |
|---|---|---|
| WO | 2012159078 A2 | 11/2012 |
| WO | 2012159078 A3 | 3/2013 |

(Continued)

OTHER PUBLICATIONS

International Preliminary Report on Patentability for International Application PCT/US2017/039832, Report issued Jan. 1, 2019, dated Jan. 10, 2019, 5 Pgs.
(Continued)

*Primary Examiner* — Vu A Le
(74) *Attorney, Agent, or Firm* — KPPB LLP

(57) ABSTRACT

Systems and methods for reducing write error rate in MeRAM applications in accordance with various embodiments of the invention are illustrated. One embodiment includes a method for a writing mechanism for a magnetoelectric random access memory cell, the method including applying a voltage of a given polarity for a given period of time across a magnetoelectric junction bit of the magnetoelectric random access memory cell, wherein application of the voltage of the given polarity across the magnetoelectric junction bit reduces the perpendicular magnetic anisotropy and magnetic coercivity of the ferromagnetic free layer through a voltage controlled magnetic anisotropy effect, and lowering the applied voltage of the given polarity before the end of the given period of time, wherein the given period of time is approximately half of a precessional period of the ferromagnetic free layer.

20 Claims, 26 Drawing Sheets

Related U.S. Application Data

(60) Provisional application No. 62/525,661, filed on Jun. 27, 2017.

(51) Int. Cl.
| | | |
|---|---|---|
| *H01F 10/32* | (2006.01) | |
| *H01L 27/22* | (2006.01) | |
| *H01L 43/10* | (2006.01) | |
| *H01L 43/02* | (2006.01) | |

(52) U.S. Cl.
CPC ........ *G11C 11/1657* (2013.01); *H01F 10/329* (2013.01); *H01F 10/3259* (2013.01); *H01F 10/3286* (2013.01); *H01L 27/228* (2013.01); *H01L 43/02* (2013.01); *H01L 43/10* (2013.01)

(58) Field of Classification Search
USPC .......................................................... 365/145
See application file for complete search history.

(56) References Cited

U.S. PATENT DOCUMENTS

| | | | |
|---|---|---|---|
| 6,114,719 | A | 9/2000 | Dill et al. |
| 6,216,239 | B1 | 4/2001 | Lien |
| 6,292,395 | B1 | 9/2001 | Lin et al. |
| 6,363,000 | B2 | 3/2002 | Perner et al. |
| 6,529,412 | B1 | 3/2003 | Chen et al. |
| 6,791,897 | B2 | 9/2004 | Choi et al. |
| 7,057,921 | B2 | 6/2006 | Valet et al. |
| 7,282,755 | B2 | 10/2007 | Pakala et al. |
| 7,403,442 | B2 | 7/2008 | Larguier et al. |
| 7,480,172 | B2 | 1/2009 | Shi et al. |
| 8,213,234 | B2 | 7/2012 | Chen et al. |
| 8,374,025 | B1 * | 2/2013 | Ranjan ................. G11C 11/161 365/171 |
| 8,482,968 | B2 | 7/2013 | Worledge et al. |
| 8,760,930 | B1 | 6/2014 | Kushnarenko et al. |
| 8,804,425 | B2 | 8/2014 | Chen et al. |
| 8,841,739 | B2 | 9/2014 | Amiri et al. |
| 8,885,395 | B2 | 11/2014 | Malmhall et al. |
| 8,891,291 | B2 | 11/2014 | Huai et al. |
| 9,099,641 | B2 | 8/2015 | Amiri et al. |
| 9,129,691 | B2 | 9/2015 | Amiri et al. |
| 9,240,799 | B1 | 1/2016 | Wang et al. |
| 9,324,403 | B2 | 4/2016 | Amiri et al. |
| 9,355,699 | B2 | 5/2016 | Amiri et al. |
| 9,361,975 | B2 | 6/2016 | Gilbert et al. |
| 9,520,552 | B2 * | 12/2016 | Khalili Amiri ......... H01L 43/10 |
| 9,978,931 | B2 | 5/2018 | Hu |
| 10,102,893 | B2 | 10/2018 | Lee |
| 10,103,317 | B2 | 10/2018 | Hu |
| 10,217,798 | B2 | 2/2019 | Hu et al. |
| 10,460,786 | B2 | 10/2019 | Lee et al. |
| 2002/0057594 | A1 | 5/2002 | Hirai |
| 2004/0241394 | A1 | 12/2004 | Burrows |
| 2005/0036361 | A1 | 2/2005 | Fukuzumi et al. |
| 2005/0062082 | A1 | 3/2005 | Bucher et al. |
| 2005/0146928 | A1 | 7/2005 | Luk et al. |
| 2006/0133137 | A1 | 6/2006 | Shin et al. |
| 2006/0239110 | A1 | 10/2006 | Ueda et al. |
| 2007/0183190 | A1 | 8/2007 | Eyckmans et al. |
| 2009/0046529 | A1 | 2/2009 | Chen et al. |
| 2010/0080048 | A1 | 4/2010 | Liu et al. |
| 2010/0091564 | A1 * | 4/2010 | Gao .................... G11C 11/1675 365/171 |
| 2010/0155687 | A1 | 6/2010 | Reyes et al. |
| 2010/0277974 | A1 | 11/2010 | Yang |
| 2011/0051502 | A1 | 3/2011 | Rao et al. |
| 2011/0260224 | A1 | 10/2011 | Hidaka |
| 2012/0176831 | A1 | 7/2012 | Xiao et al. |
| 2013/0015542 | A1 | 1/2013 | Wang et al. |
| 2013/0128658 | A1 | 5/2013 | Alam et al. |
| 2013/0200323 | A1 | 8/2013 | Pham et al. |
| 2013/0343117 | A1 | 12/2013 | Lua et al. |
| 2014/0070344 | A1 | 3/2014 | Khalili Amiri et al. |
| 2014/0071728 | A1 | 3/2014 | Khalili Amiri et al. |
| 2014/0071732 | A1 | 3/2014 | Khalili Amiri et al. |
| 2014/0124882 | A1 | 5/2014 | Amiri et al. |
| 2014/0159121 | A1 | 6/2014 | Fukami et al. |
| 2014/0169085 | A1 | 6/2014 | Wang et al. |
| 2014/0177327 | A1 | 6/2014 | Khalili Amiri et al. |
| 2014/0197459 | A1 | 7/2014 | Kis et al. |
| 2014/0247653 | A1 | 9/2014 | Wang et al. |
| 2014/0334216 | A1 | 11/2014 | Wang et al. |
| 2015/0064492 | A1 | 3/2015 | Rasic et al. |
| 2015/0085561 | A1 | 3/2015 | Maeda et al. |
| 2015/0122315 | A1 | 5/2015 | Hyeonjin et al. |
| 2015/0137289 | A1 * | 5/2015 | Khalili Amiri ....... G11C 11/161 257/421 |
| 2015/0249096 | A1 | 9/2015 | Lupino et al. |
| 2015/0269995 | A1 | 9/2015 | Kajigaya |
| 2015/0332749 | A1 | 11/2015 | Khalili et al. |
| 2016/0027842 | A1 | 1/2016 | Khalili et al. |
| 2016/0197263 | A1 | 7/2016 | Hu |
| 2016/0204162 | A1 | 7/2016 | Hu et al. |
| 2016/0240771 | A1 | 8/2016 | Hu |
| 2016/0358973 | A1 | 12/2016 | Katine |
| 2017/0033281 | A1 | 2/2017 | Hu |
| 2017/0084322 | A1 | 3/2017 | Wang et al. |
| 2017/0092842 | A1 | 3/2017 | Khalili Amiri et al. |
| 2017/0178705 | A1 | 6/2017 | Buhrman et al. |
| 2017/0323929 | A1 | 11/2017 | Bessonov et al. |
| 2017/0352701 | A1 | 12/2017 | Gan et al. |
| 2017/0372761 | A1 | 12/2017 | Lee |
| 2017/0372762 | A1 | 12/2017 | Lee |
| 2018/0374526 | A1 | 12/2018 | Lee et al. |
| 2019/0189908 | A1 | 6/2019 | Ebrahimi et al. |
| 2019/0189912 | A1 | 6/2019 | Ebrahimi |

FOREIGN PATENT DOCUMENTS

| | | |
|---|---|---|
| WO | 2018005698 A1 | 1/2018 |
| WO | 2018005699 A1 | 1/2018 |
| WO | 2019006037 A1 | 1/2019 |

OTHER PUBLICATIONS

International Preliminary Report on Patentability for International Application PCT/US2017/039833, Report issued Jan. 1, 2019, dated Jan. 10, 2019, 8 Pgs.

International Search Report and Written Opinion for International Application No. PCT/US2017/039832, Search completed Aug. 8, 2017, dated Aug. 29, 2017, 6 Pgs.

International Search Report and Written Opinion for International Application No. PCT/US2017/039833, Search completed Aug. 22, 2017, dated Sep. 6, 2017, 22 Pgs.

International Search Report and Written Opinion for International Application No. PCT/US2018/039867, Search completed Aug. 29, 2018, dated Sep. 19, 2018, 12 Pgs.

Akinwande et al., "Two-dimensional flexible nanoelectronics", Nature Communications, Dec. 17, 2014, vol. 5, pp. 1-12.

Alzate et al., "Voltage-Induced Switching of CoFeB—MgO Magnetic Tunnel Junctions", 56th Conference on Magnetism and Magnetic Materials, Scottsdale, Arizona, USA, EG-11 (2011), 1 pg.

Alzate et al., "Voltage-induced switching of nanoscale magnetic tunnel junctions", Conference Paper in Electron Devices Meeting, 1988. IEDM '88. Technical Digest, International, Jan. 2012, 29.5. 1-29.5.4.

Amiri et al., "Electric-Field-Controlled Magnetoelectric RAM: Progress, Challenges, and Scaling", IEEE Transactions on Magnetics, Nov. 2015, vol. 51, No. 11, 7 pgs.

Amiri et al., "Electric-field-induced thermally assisted switching of monodomain magnetic bits", Journal of Applied Physics, Jan. 7, 2013, vol. 113. pp. 013912-1-013912-5.

Amiri et al., "Switching current reduction using perpendicular anisotropy in CoFeB—MgO magnetic tunnel junctions", Applied Physics Letters, Mar. 17, 2011, vol. 98, pp. 112507-1-112507-3.

Amiri et al., "Voltage-Controlled Magnetic Anisotropy in Spintronic Devices", SPIN, Oct. 29, 2012, vol. 2, No. 3, pp. 1240002-1-1240002-9.

(56) References Cited

OTHER PUBLICATIONS

Bae et al., "Roll-to-roll production of 30-inch graphene films for transparent electrodes", Nature Nanotechnology, published online Jun. 20, 2010, vol. 5, pp. 574-578.
Britnell et al., "Resonant tunnelling and negative differential conductance in graphene transistors", Nature Communications, Apr. 30, 2013, vol. 4, 5 pgs.
Britnell et al., "Strong Light-Matter Interactions in Heterostructures of Atomically Thin Films", Science, Jun. 14, 2013, vol. 340, pp. 1311-1314.
Brown, "Thermal Fluctuations of a Single-Domain Particle", Physical Review, Jun. 1, 1963, vol. 130, No. 5, pp. 1677-1686.
Buscema et al., "Photovoltaic effect in few-layer black phosphorus PN junctions defined by local electrostatic gating", Nature Communications, Aug. 28, 2014, vol. 5, 6 pgs.
Butler et al., "Progress, Challenges, and Opportunities in Two-Dimensional Materials Beyond Graphene", ACSNano, Mar. 6, 2013, vol. 7, No. 4, pp. 2898-2926.
Chang et al., "A 0.5V 4Mb Logic-Process compatible Embedded Resistive RAM (ReRAM) in 65nm CMOS Using Low-voltage Current-Mode Sensing Scheme with 45ns Random Read Time", IEEE International Solid-State Circuits Conference, Feb. 22, 2012, pp. 434-436.
Chatterjee et al., "Dual-Source-Line-Bias Scheme to Improve the Read Margin and Sensing Accuracy of STTRAM in Sub-90-nm Nodes", IEEE Transactions on Circuits and Systems—II: Express Briefs, Mar. 8, 2010, vol. 57, No. 3, pp. 208-212.
Chen et al., "A 40 nm fully Functional SRAM with BL Swing and WL Pulse Measurement Scheme for Eliminating a Need for Additional Sensing Tolerance Margins", 2011 Symposium on VLSI Circuits Digest of Technical Papers, Jun. 15-17, 2011, pp. 70-71.
Chen et al., "Compact Measurement Schemes for Bit-Line Swing, Sense Amplifier Offset Voltage, and Word-Line Pulse Width to Characterize Sensing Tolerance Margin in a 30 nm Fully Functional Embedded SRAM", IEEE Journal of Solid-State Circuits, Apr. 2012, vol. 47, No. 4, pp. 969-980.
Choi et al., "Lateral MoS2 p-n Junction Formed by Chemical Doping for Use in High-Performance Optoelectronics", ACSNano, Aug. 18, 2014, vol. 8, No. 9, pp. 9332-9340.
Dorrance et al., "Diode-MTJ Crossbar Memory Cell Using Voltage-Induced Unipolar Switching for High-Density MRAM", IEEE Electron Device Letters, Jun. 2013, vol. 34, No. 6, pp. 753-755.
Emori et al., "Large voltage-induced modification of spin-orbit torques in Pt/Co/GdOx", Appl. Phys. Lett. 105, 222401 (2014), 4 pgs.
Fukada et al., "Non-volatile Random Access Memory and NAND Flash Memory Integrated Solid-State Drives with Adaptive Codeword Error Correcting Code for 3.6 Times Acceptable Raw Bit Error Rate Enhancement and 97% Power Reduction", Japanese Journal of Applied Physics, Apr. 20, 2011, vol. 50, pp. 04DE09-1-04DE09-7.
Furchi et al., "Photovoltaic Effect in an Electrically Tunable van der Waals Heterojunction", Nano Letters, Jul. 24, 2014, vol. 14, pp. 4785-4791.
Geim et al., "Van der Waals heterostructures", Nature, Jul. 25, 2013, vol. 499, pp. 419-425.
Georgiou et al., "Vertical field-effect transistor based on graphene-WS2 heterostructures for flexible and transparent electronics", Letters Nature Nanotechnology, published online Dec. 23, 2012, vol. 8, pp. 100-103.
Grezes et al., "Ultra-low switching energy and scaling in electric-field-controlled nanoscale magnetic tunnel junctions with high resistance-area product", Applied Physics Letters, 2016, vol. 108, pp. 012403-1-012403-5.
Haigh, S. J., "Cross-sectional imaging of individual layers and buried interfaces of graphene-based heterostructures and superlattices", Letters Nature Materials, published online Jul. 29, 2012, Sep. 2012, vol. 11, pp. 764-767.
Halupka et al., "Negative-Resistance Read and Write Schemes for SST-MRAM in 0.13µm CMOS", 2010 IEEE International Solid-State Circuits Conference, ISSCC 2010, Feb. 9, 2010, pp. 256-258.

Huai et al., "Observation of spin-transfer switching in deep submicron-sized and low-resistance magnetic tunnel junctions", Applied Physics Letter, Apr. 19, 2004, vol. 84, No. 16, pp. 3118-3120.
Huang, J.-K. et al., "Large-Area Synthesis of Highly Crystalline WSe2 Monolayers and Device Applications", ACSNano, published online Dec. 14, 2013, vol. 8, No. 1, pp. 923-930.
Ikeda et al., "A perpendicular-anistropy CoFeB—MgO magnetic tunnel junction", Nature Materials, Sep. 2010 (published online Jul. 11, 2010), vol. 9, pp. 721-724.
Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme", IEEE International Electron Devices Meeting (IEDM), Dec. 7-9, 2015, pp. 25.1.1-25.1.4.
Jariwala, D. et al., "Emerging Device Applications for Semiconducting Two-Dimensional Transition Metal Dichalcogenides", ACSNano, published online Jan. 29, 2014, vol. 8, No. 2, pp. 1102-1120.
Kalitsov et al., "Bias dependence of tunneling magnetoresistance in magnetic tunnel junctions with asymmetric barriers", Journal of Physics: Condensed Matter, Nov. 6, 2013, vol. 25, 496005, 8 pgs.
Kanai et al., "Electric field-induced magnetization reversal in a perpendicular-anisotropy CoFeB—MgO magnetic tunnel junction", Applied Physics Letters, Sep. 18, 2012, vol. 101, pp. 122403-1-122403-3.
Kanai et al., "Magnetization switching in a CoFeB/MgO magnetic tunnel junction by combining spin-transfer torque and electric field-effect", Applied Physics Letters, May 30, 2014, vol. 104, pp. 212406-1-212406-3.
Kang et al., "High-Speed, Low-Power, Magnetic Non-Volatile Flip-Flop with voltage-Controlled, Magnetic Anisotropy Assistance", IEEE Magnetics Letters, Nov. 8, 2016, vol. 7, 5 pgs.
Katine et al., "Current-Driven magnetization Reversal and Spin-Wave Excitations in Co/Cu/Co Pillars", Physical Review Letters, Apr. 3, 2000, vol. 84, No. 14, pp. 3149-3152.
Katine et al., "Device implications of spin-transfer torques", Journal of Magnetism and Magnetic Materials, Apr. 2008, vol. 320, pp. 1217-1226.
Kim et al., "A 45nm 1Mb Embedded STT-MRAM with design techniques to minimize read-disturbance", 2011 Symposium on VLSI Circuits Digest of Technical Papers, Jun. 2011, pp. 296-297.
Kim et al., "Constant-Load Energy Recovery Memory for Efficient High-Speed Operation", International Symposium on Low Power Electronics and Design, ISLPED '04, Aug. 11, 2004, pp. 240-243.
Kobayashi, T. et al., "Production of a 100-m-long high-quality graphene transparent conductive film by roll-to-roll chemical vapor deposition and transfer process", Applied Physics Letters, Jan. 17, 2013, vol. 102, pp. 023112-1-023112-4.
Landau et al., "On the theory of the dispersion of magnetic permeability in ferromagnetic bodies", Ukr. J. Phys., 2008, vol. 53, Special Issue, pp. 14-22.
Lee, C.-H. et al., "Atomically thin p-n junctions with van der Waals heterointerfaces", Nature Nanotechnology, published online Aug. 10, 2014, vol. 9, pp. 676-681.
Lee, G.-H. et al., "Flexible and Transparent MoS2 Field-Effect Transistors on Hexagonal Boron Nitride-Graphene Heterostructures", ACSNano, published online Aug. 8, 2013, vol. 7, No. 9, pp. 7931-7936.
Lee, Y.-H. et al., "Synthesis of Large-Area MoS2 Atomic Layers with Chemical Vapor Deposition", Advanced Materials, Mar. 30, 2012, vol. 24, pp. 2320-2325.
Lee et al., "A Word Line Pulse Circuit Technique for Reliable Magnetoelectric Random Access Memory", IEEE Transactions on Very Large Scale Integration (VLSI) Systems, Jul. 2017, vol. 25, No. 7, pp. 2027-2034.
Lee et al., "Analysis and Compact Modeling of Magnetic Tunnel Junctions Utilizing Voltage-Controlled Magnetic Anisotropy", IEEE Transactions on Magnetics 54, No. 4, 2018, pp. 1-9.
Lee et al., "Design of a Fast and Low-Power Sense Amplifier and Writing Circuit for High-Speed MRAM", IEEE Transactions on Magnetics, May 2015, vol. 51, No. 5, 7 pgs.

(56) References Cited

OTHER PUBLICATIONS

Lee et al., "Low-Power, High-Density Spintronic Programmable Logic with Voltage-Gated Spin Hall Effect in Magnetic Tunnel Junctions", IEEE Magnetics Letters, May 4, 2016, vol. 7, 5 pgs.

Lee et al., "Source Line Sensing in Magneto-Electric Random-Access Memory to Reduce Read Disturbance and Improve Sensing Margin", IEEE Magnetics Letter, Jun. 20, 2016, vol. 7, 5 pgs.

Li, L. et al., "Black phosphorus field-effect transistors", Nature Nanotechnology, May 2014, vol. 9, pp. 372-377.

Lin, Y.-M. et al., "Wafer-Scale Graphene Integrated Circuit", Science, Jun. 10, 2011. vol. 332, pp. 1294-1297.

Liu, W. et al., "Role of Metal Contacts in Designing High-Performance Monolayer n-Type WSe2 Field Effect Transistors", Nano Letters, Mar. 25, 2013, vol. 13, pp. 1983-1990.

Liu, Leitao et al., "On Monolayer MoS2 Field-Effect Transistors at the Scaling Limit", IEEE Transactions on Electron Devices, vol. 60, No. 12, Dec. 2013, pp. 4133-4139.

Mandelman et al., "Challenges and future directions for the scaling of dynamic random-access Memory (DRAM)", IBM. F. Res & Dev, Mar./May 2002, vol. 46, No. 2/3, pp. 187-212.

Meng et al., "Electric field control of spin re-orientation in perpendicular magnetic tunnel junctions—CoFeB and MgO thickness dependence", Applied Physics Letters, Jul. 31, 2014, vol. 105, pp. 042410-1-042410-5.

Miro, P. et al., "An atlas of two-dimensional materials", Chemical Society Reviews, Mar. 5, 2014, vol. 43, pp. 6537-6554.

Newhouse-Illige et al., "Voltage-controlled interlayer coupling in perpendicularly magnetized magnetic tunnel junctions", Nat. Commun. 8, 15232 doi: 10.1038/ncomms15232, Published May 16, 2017, 7 pgs.

Novoselov, K. S., "Electric Field Effect in Atomically Thin Carbon Films", Science, Oct. 22, 2004, vol. 306, pp. 666-669.

Ong, P. et al., "Strain-induced Giant Magnetoelectric Effect in Heavy Metal/Magnet/Insulator Junctions", 59th Conference on Magnetism and Magnetic Materials, Honolulu, Hawaii, USA, EE-13 (2014), 2 pgs.

Ong et al., "Giant voltage modulation of magnetic anisotropy in strained heavy metal/magnet/insulator heterostructures", Physical Review B 92, 020407(R), Jul. 20, 2015, pp. 020407-1-020407-5.

Otsuka et al., "a 4Mb conductive-Bridge Resistive Memory with 2.3GB/s Read-Throughput and 216MB/s Program-Throughput", 2011 IEEE International Solid-State Circuits Conference, ISSCC2011, Feb. 22, 2011, pp. 210-211.

Pospischil, A. et al., "Solar-energy conversion and light emission in an atomic monolayer p-n diode", Nature Nanotechnology, published online Mar. 9, 2014, vol. 9, pp. 257-261.

Qazi et al., "Challenges and Directions for Low-Voltage SRAM", IEEE Design & Test of Computers, Jan./Feb. 2011, pp. 32-43.

Radisavljevic, B. et al., "Single-Layer MoS2 Transistors", Nature Nanotechnology, published online Jan. 30, 2011, vol. 6, pp. 147-150.

Rippard et al., "Thermal relaxation rates of magnetic nanoparticles in the presence of magnetic fields and spin-transfer effects", Physical Review B, Aug. 29, 2011, pp. 064439-1-064439-7.

Roy, T. et al., "Field-Effect Transistors Built from All Two-Dimensional Material Components", ACSNano, published online Apr. 28, 2014, vol. 8, No. 6, pp. 6259-6264.

Shamsi et al., "Reliable and High Performance STT-MRAM Architectures Based on Controllable-Polarity Devices", IEEE International Conference on Computer Design (ICCD), Oct. 18-21, 2015, pp. 343-350.

Shiota, Y. et al., "Induction of coherent magnetization switching in a few atomic layers of FeCo using voltage pulses", Nature Materials, published online Nov. 13, 2011, vol. 11, pp. 39-43.

Shiota et al., "Pulse voltage-induced dynamic magnetization switching in magnetic tunneling junctions with high resistance-area product", Applied Physics Letters, Sep. 5, 2012, vol. 101, pp. 102406-1-102406-4.

Song et al., "Bidirectional Two-Terminal Switching Device for Crossbar Array Architecture", IEEE Electron Device Letters, Aug. 2011, vol. 32, No. 8, pp. 1023-1025.

Tian, H. et al., "Novel Field-Effect Schottky Barrier Transistors Based on Graphene-MoS2 Heterojunctions", Scientific Reports, Aug. 11, 2014, vol. 4, 9 pgs.

Tsuchida et al., "A 64Mb MRAM with Clamped-Reference and Adequate-Reference Schemes", IEEE International Solid-State Circuits Conference, ISSCC 2010/Session 14/ Non-Volatile Memory, Feb. 9, 2010, pp. 258-260.

Wang, H. et al., "Integrated Circuits Based on Bilayer MoS2 Transistors", Nano Letters, Aug. 3, 2012, vol. 12, pp. 4674-4680.

Wang, Q. H., "Electronics and optoelectronics of two-dimensional transition metal dichalcogenides", Nature Nanotechnology, published online Nov. 6, 2012, vol. 7, pp. 699-712.

Wang, X. et al., "Chemical Vapor Deposition Growth of Crystalline Monolayer MoSe2", ACS Nano, published online Mar. 29, 2014, vol. 8, No. 5, pp. 5125-5131.

Wang et al., "Comparative Evaluation of Spin-Transfer-Torque and Magnetoelectric Random Access Memory", IEEE Journal on Emerging and Selected Topics in Circuits and Systems, Jun. 2016, vol. 6, No. 2, pp. 134-145.

Wang et al., "Design and Implementation of Dynamic Word-Line Pulse Write Margin Monitor for SRAM", IEEE, Dec. 2-5, 2012, pp. 116-119.

Wang et al., "Electric-field-assisted switching in magnetic tunnel junctions", Nature Materials, published online Nov. 13, 2011, vol. 11, pp. 64-68.

Wang et al., "Low-power non-volatile spintronic memory: STT-RAM and beyond", J. Phys. D: Appl. Phys., Jan. 31, 2013, vol. 46, 10 pgs.

Wang et al., "Magnetoelectric Random Access Memory-Based Circuit Design by Using Voltage-Controlled Magnetic Anisotrophy in Magnetic Tunnel Junctions", IEEE Transactions on Nanotechnology, Nov. 2015, vol. 14, No. 6, pp. 992-997.

Worledge et al., "Spin torque switching of perpendicular Ta | CoFeB | MgO-based magnetic tunnel junctions", Applied Physics Letters, Jan. 10, 2011, vol. 98, pp. 022501-1-022501-3.

Yoshimoto et al., "A 40-nm 8T SRAM with Selective Source Line Control of Read Bitlines and Address Preset Structure", Published in Custom Integrated Circuits Conference (CICC), IEEE, Sep. 22-25, 2013, 4 pgs.

Yu et al., "Highly efficient gate-tunable photocurrent generation in vertical heterostructures of layered materials", Nature Nanotechnology, published online Oct. 27, 2013, vol. 8, pp. 952-958.

Yu et al., "Vertically stacked multi-heterostructures of layered materials for logic transistors and complementary inverters", Nature Materials, published online Dec. 16, 2012, Mar. 2013, vol. 12, pp. 246-252.

Zhan, Y. et al., "Large-Area Vapor-Phase Growth and Characterization of MoS2 Atomic Layers on a Si02 Substrate", Small, Feb. 15, 2012, vol. 8, No. 7, pp. 966-971.

Zhang, Y. et al., "Controlled Growth of High-Quality Monolayer WS2 Layers on Sapphire and Imaging Its Grain Boundary", ACS Nano, published online Sep. 18, 2013, vol. 7, No. 10, pp. 8963-8971.

International Preliminary Report on Patentability for International Application PCT/US2018/039867, Report issued Dec. 31, 2019, dated Jan. 9, 2020, 6 pgs.

* cited by examiner

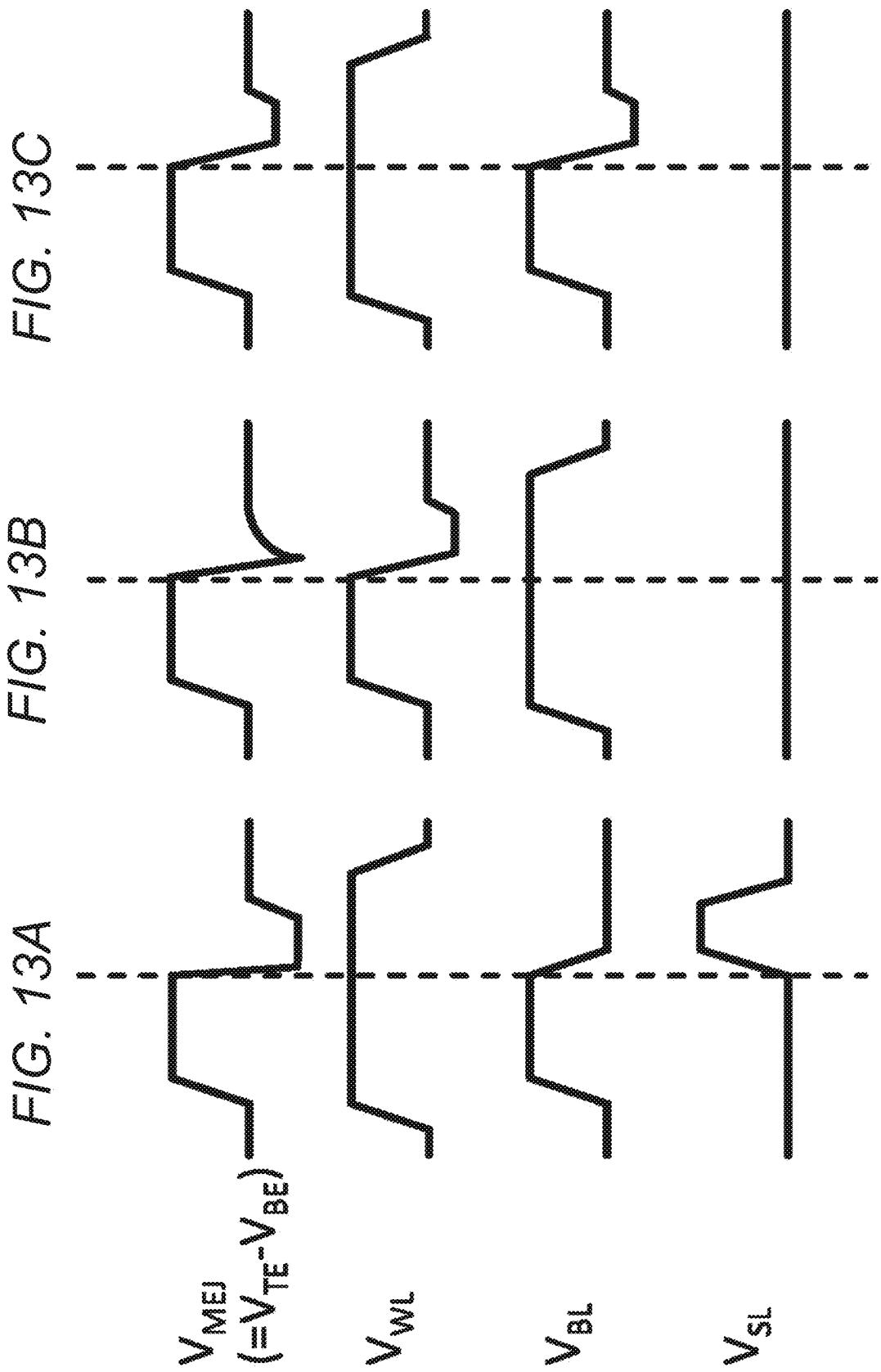

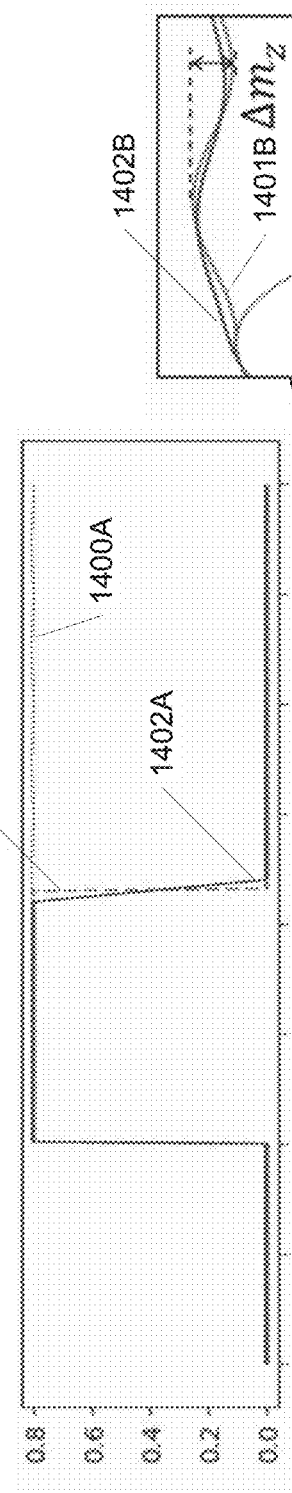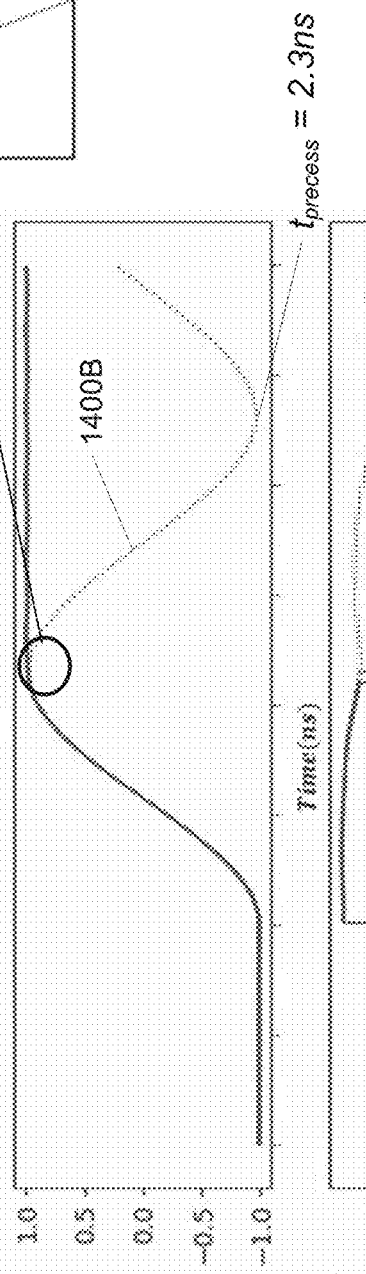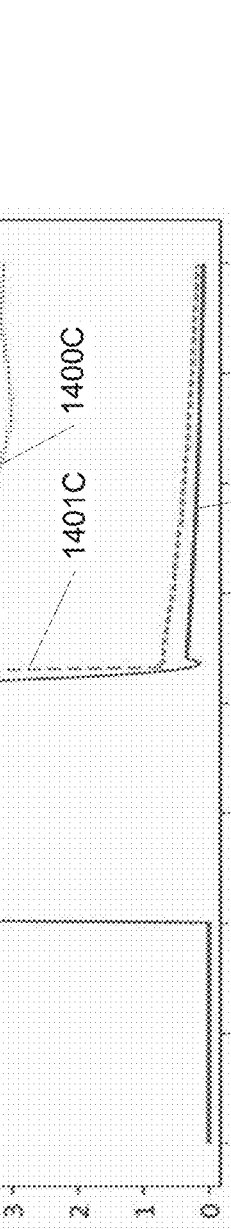
FIG. 14A
FIG. 14B
FIG. 14C

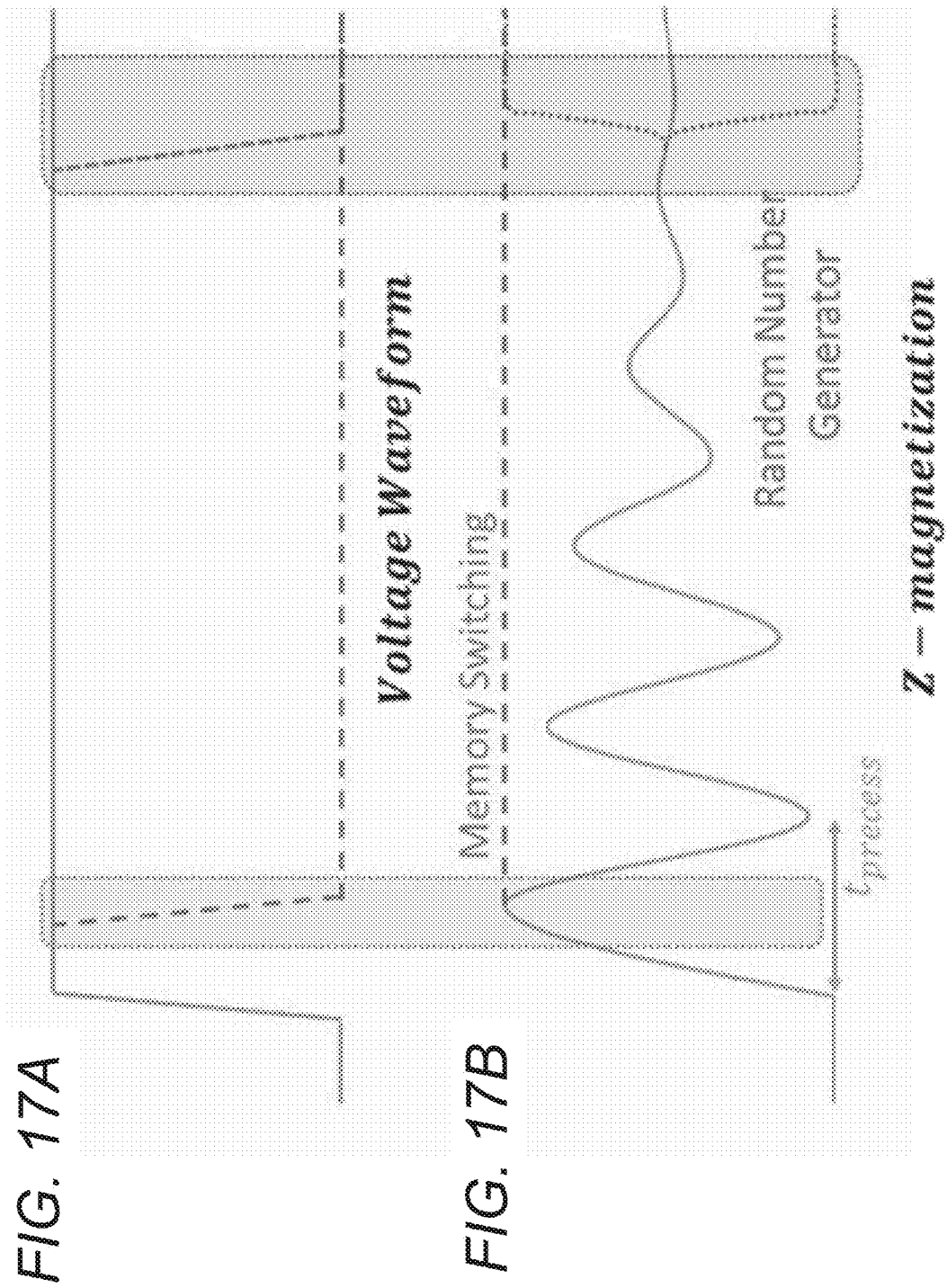

| Parameter | Description | Value |
|---|---|---|
| $d$ | MTJ Diameter | 60 nm |
| $d_{MgO}$ | MgO thickness | 1.1 nm |
| $t_{fl}$ | Free layer thickness | 1.1 nm |
| $M_s$ | Saturization Magnetisation | $1.2 \times 10^6$ A/m |
| $\zeta$ | VCMA Coefficient | 80 fJ/V–m |
| $\alpha$ | LLG damping factor | 0.02 |
| $\gamma$ | Gyromagnetic ratio | $2.14 \times 10^6$ m/A–s |
| $H_{ext}$ | External bias field | [−13000, 0, 0] A/m |
| $N$ | Demagnetization factor | [0.02, 0.02, 0.96] A/m |

FIG. 20

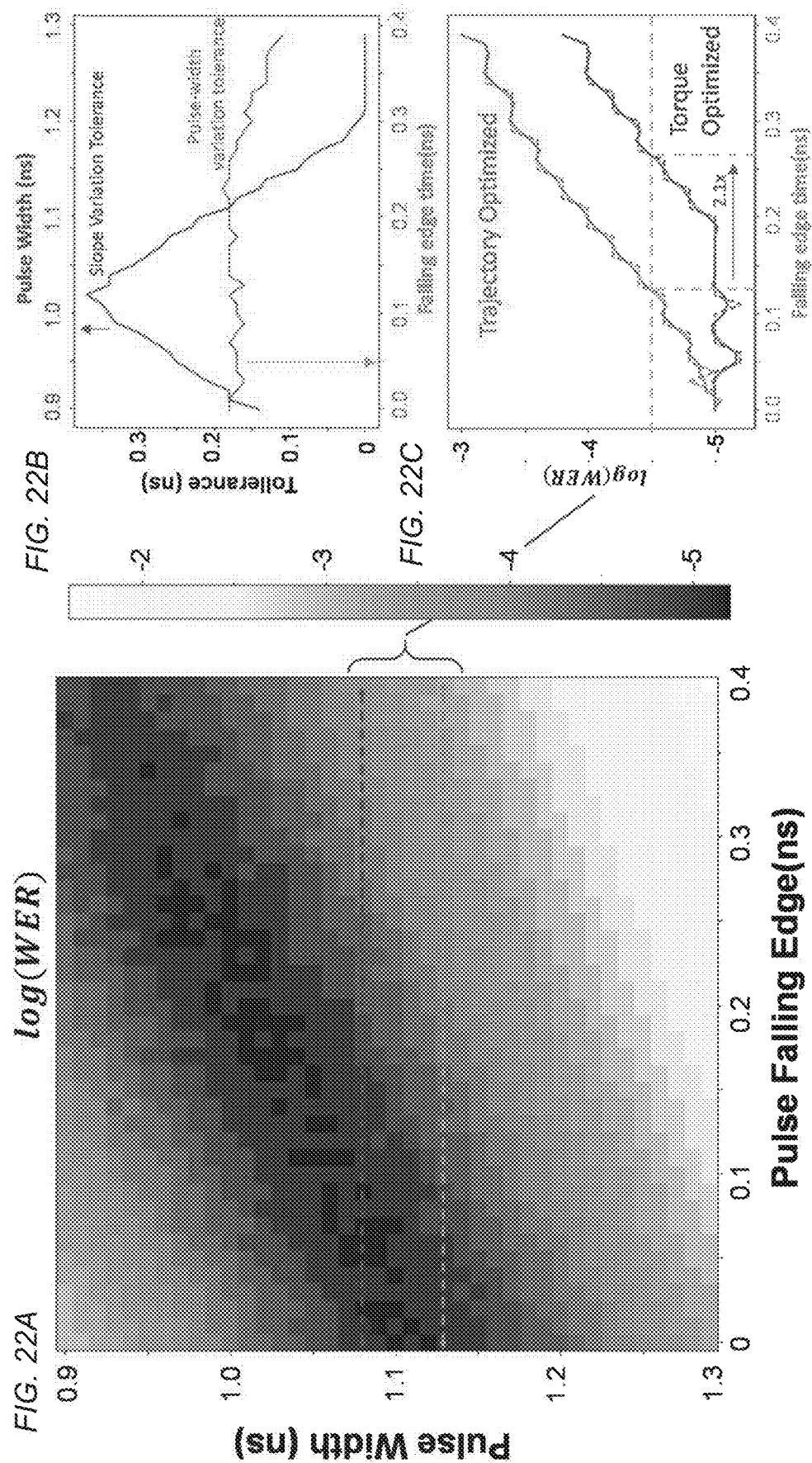

SYSTEMS AND METHODS FOR OPTIMIZING MAGNETIC TORQUE AND PULSE SHAPING FOR REDUCING WRITE ERROR RATE IN MAGNETOELECTRIC RANDOM ACCESS MEMORY

CROSS-REFERENCE TO RELATED APPLICATIONS

The current application is a continuation in part of U.S. patent application Ser. No. 16/020,933 entitled "Systems and Methods for Reducing Write Error Rate in Magnetoelectric Random Access Memory Through Pulse Sharpening and Reverse Pulse Schemes," filed Jun. 27, 2018, which claims priority to U.S. Provisional Patent Application No. 62/525,661 entitled "A Reverse Pulse (RVP) Scheme in Magnetoelectric Random Access Memory (MeRAM) for Reducing Write Error Rate," filed Jun. 27, 2017. The disclosures of U.S. patent application Ser. No. 16/020,933 and U.S. Provisional Patent Application No. 62/525,661 are hereby incorporated by reference in their entireties for all purposes.

FIELD OF THE INVENTION

The present invention generally relates to magnetoelectric random access memory and, more specifically, to writing schemes for magnetoelectric random access memory.

BACKGROUND

Devices that rely on electricity and magnetism underlie much of modern electronics. Researchers have recently begun to develop and implement devices that take advantage of both electricity and magnetism in spin-electronic (or so-called "spintronic") devices. These devices utilize quantum-mechanical magnetoresistance effects, such as giant magnetoresistance ("GMR") and tunnel magnetoresistance ("TMR"). GMR and TMR principles regard how the resistance of a thin film structure that includes alternating layers of ferromagnetic and non-magnetic layers depends upon whether the magnetizations of ferromagnetic layers are in a parallel or antiparallel alignment. For example, magnetoresistive random-access memory ("MRAM") is a technology that is being developed that typically utilizes TMR phenomena in providing for alternative random-access memory ("RAM") devices. In a typical MRAM bit, data is stored in a magnetic structure that includes two ferromagnetic layers separated by an insulating layer—this structure is conventionally referred to as a magnetic tunnel junction ("MTJ"). The magnetization of one of the ferromagnetic layers (the fixed layer) is permanently set to a particular direction, while the other ferromagnetic layer (the free layer) can have its magnetization direction free to change. Generally, the MRAM bit can be written by manipulating the magnetization of the free layer such that it is either parallel or antiparallel with the magnetization of the fixed layer; and the bit can be read by measuring its resistance (since the resistance of the bit will depend on whether the magnetizations are in a parallel or antiparallel alignment).

MRAM technologies initially exhibited a number of technological challenges. The first generation of MRAM utilized the Oersted field generated from current in adjacent metal lines to write the magnetization of the free layer, which required a large amount of current to manipulate the magnetization direction of the bit's free layer when the bit size shrinks down to below 100 nm. Thermal assisted MRAM ("TA-MRAM") utilizes heating of the magnetic layers in the MRAM bits above the magnetic ordering temperature to reduce the write field. This technology also requires high power consumption and long wire cycles. Spin transfer torque MRAM ("STT-MRAM") utilizes the spin-polarized current exerting torque on the magnetization direction in order to reversibly switch the magnetization direction of the free layer. The challenge for STTMRAM remains that the switching current density needs to be further reduced.

SUMMARY OF THE INVENTION

Systems and methods for reducing write error rate in MeRAM applications in accordance with various embodiments of the invention are illustrated. One embodiment includes a method for a writing mechanism for a magnetoelectric random access memory cell, the method including applying a voltage of a given polarity for a given period of time across a magnetoelectric junction bit of the magnetoelectric random access memory cell, wherein the magnetoelectric junction bit includes a ferromagnetic free layer, a ferromagnetic fixed layer, and a dielectric layer interposed between the ferromagnetic free layer and the ferromagnetic fixed layer, application of the voltage of the given polarity across the magnetoelectric junction bit reduces the perpendicular magnetic anisotropy and magnetic coercivity of the ferromagnetic free layer through a voltage controlled magnetic anisotropy effect, and the magnetization of the ferromagnetic free layer changes direction in response to the application of the voltage of the given polarity for the given period of time, and lowering the applied voltage of the given polarity before the end of the given period of time, wherein the given period of time is approximately half of a precessional period of the ferromagnetic free layer.

In another embodiment, the magnetoelectric random access memory cell includes a first terminal coupled to a bit line, a second terminal coupled to a source line, and a third terminal coupled to a word line, and the magnetoelectric junction bit is coupled to the drain of an MOS transistor.

In a further embodiment, the method further includes applying a voltage of a polarity opposite the given polarity across the magnetoelectric junction bit at the end of the application of the voltage of the given polarity.

In still another embodiment, the voltage of the given polarity is applied using a pulse generator.

In a still further embodiment, the pulse generator is selected from the group of a bit line driver, a source line driver, and a word line driver.

In yet another embodiment, the rising edge of the application of the voltage of the given polarity decreases the perpendicular magnetic anisotropy and causes a precessional motion of magnetization between two states of the ferromagnetic free layer, the magnetization direction of the ferromagnetic free layer is different between the two states, and the falling edge of the application of the voltage of the given polarity restores the decrease in the perpendicular magnetic anisotropy and stops the precessional motion of magnetization.

In a yet further embodiment, the method further includes applying a voltage of a polarity opposite the given polarity across the magnetoelectric junction bit at the end of the application of the voltage of the given polarity, wherein the voltage of the polarity opposite the given polarity is applied across the magnetoelectric junction bit subsequent or near simultaneously with the falling edge of the application of the voltage of the given polarity to increase the perpendicular magnetic anisotropy of the ferromagnetic free layer.

In another additional embodiment, the voltage of the polarity opposite the given polarity is applied using capacitive coupling from the word line to the magnetoelectric junction bit through the gate-to-source-capacitance.

In a further additional embodiment, the voltage of the polarity opposite the given polarity is applied through generating a negative voltage with respect to ground on the bit line while keeping a voltage of the source line at ground level.

In another embodiment again, the voltage of the polarity opposite the given polarity is applied by generating a positive voltage pulse on the source line after a write voltage pulse on the bit line.

A further embodiment again includes a magnetoelectric random access memory cell including a magnetoelectric junction bit including a ferromagnetic free layer, a ferromagnetic fixed layer, and a dielectric layer interposed between the ferromagnetic free layer and the ferromagnetic fixed layer, wherein the magnetoelectric junction bit is configured such that when a voltage of a given polarity is applied across the magnetoelectric junction bit for half a precessional period of the ferromagnetic free layer, the perpendicular magnetic anisotropy and magnetic coercivity of the ferromagnetic free layer are reduced through a voltage controlled magnetic anisotropy effect and the magnetization of the ferromagnetic free layer changes direction, and wherein the magnetoelectric junction bit is configured such that when the applied voltage of the given polarity is reduced before the end of the half precessional period of the ferromagnetic free layer, a magnetic torque of the ferromagnetic free layer is reduced before a maximum magnetic trajectory of the ferromagnetic free layer is reached.

In still yet another embodiment, the magnetoelectric random access memory cell further includes a first terminal coupled to a bit line, a second terminal coupled to a source line, and a third terminal coupled to a word line.

In a still yet further embodiment, the magnetoelectric junction bit is coupled to the drain of an MOS transistor.

In still another additional embodiment, the voltage of the given polarity is applied using a pulse generator.

In a still further additional embodiment, the pulse generator is selected from the group of a bit line driver, a source line driver, and a word line driver.

In still another embodiment again, the rising edge of the application of the voltage of the given polarity decreases the perpendicular magnetic anisotropy and causes a precessional motion of magnetization between two states of the ferromagnetic free layer, wherein the magnetization direction of the ferromagnetic free layer is different between the two states, and the falling edge of the application of the voltage of the given polarity restores the decrease in the perpendicular magnetic anisotropy and stops the precessional motion of magnetization.

In a still further embodiment again, a voltage of the polarity opposite the given polarity is applied across the magnetoelectric junction bit subsequent or near simultaneously with the falling edge of the application of the voltage of the given polarity to increase the perpendicular magnetic anisotropy of the ferromagnetic free layer.

In yet another additional embodiment, the voltage of the polarity opposite the given polarity is applied using capacitive coupling from the word line to the magnetoelectric junction bit through the gate-to-source-capacitance.

In a yet further additional embodiment, the voltage of the polarity opposite the given polarity is applied through generating a negative voltage with respect to ground on the bit line while keeping a voltage of the source line at ground level.

In yet another embodiment again, the voltage of the polarity opposite the given polarity is applied by generating a positive voltage pulse on the source line after a write voltage pulse on the bit line.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as exemplary embodiments of the invention and should not be construed as a complete recitation of the scope of the invention.

FIGS. 13A-13C conceptually illustrate three examples of applying a reverse voltage on the MEJ after the write pulse in accordance with various embodiments of the invention.

DETAILED DESCRIPTION

Turning now to the drawings, reverse pulse ("RVP") schemes for reducing write error rate ("WER") in magnetoelectric random access memory ("MeRAM") applications are illustrated. MeRAM cells in accordance with various embodiments of the invention can be implemented with voltage-controlled magnetic anisotropy-based MTJs ("VMTJs"). A VMTJ can be referred to as an MTJ that utilizes an electric field to facilitate the switching of the magnetization direction of the free layer (i.e., "write" to it) as opposed to (or in some cases, in addition to) using a current. Generally, the coercivity of the free layer of a VMTJ can be reduced using voltage-controlled magnetic anisotropy ("VCMA") phenomena, thereby making the free layer more easily switched to the opposite direction (i.e., "writeable"). Examples of such applications are described in International Patent Application Number PCT/US2012/038693, entitled "Voltage-Controlled Magnetic Anisotropy (VCMA) Switch and Magneto-electric Memory (MERAM)," by Khalili Amiri et al., the disclosure of which is herein incorporated by reference in its entirety.

In many embodiments, a MeRAM can be implemented with a magnetoelectric junction ("MEJ") bit that operates as a storage element. For the purposes of describing the invention, MEJ can be used to refer to devices that use VCMA principles to help realize two distinct information states. Examples of such devices include but are not limited to VMTJs and VCMA switches, such as those discussed in International Patent Application Number PCT/US2012/038693. In some embodiments, an MEJ includes at least two ferromagnetic layers divided by a tunneling barrier, which can be implemented using a variety of materials such as but not limited to MgO. The magnetic moment of one layer can switch freely by using an electric field, electric current, spin torque generated by spin-orbit interaction, magnetic field, or a combination of these. Typically, the magnetic moment of the other layer is fixed. The conventional write operation for an MEJ can be implemented by giving a single voltage pulse from the top electrode ("TE") to the bottom electrode ("BE") of the device. When a pulse is applied to the TE, the VCMA effect can reduce the perpendicular magnetic anisotropy ("PMA") of the free layer. The VCMA effect can be explained in terms of the electric-field-induced change of occupancy of atomic orbitals at the interface, which, in conjunction with spin-orbit interaction, results in a change of anisotropy.

Figure 1:
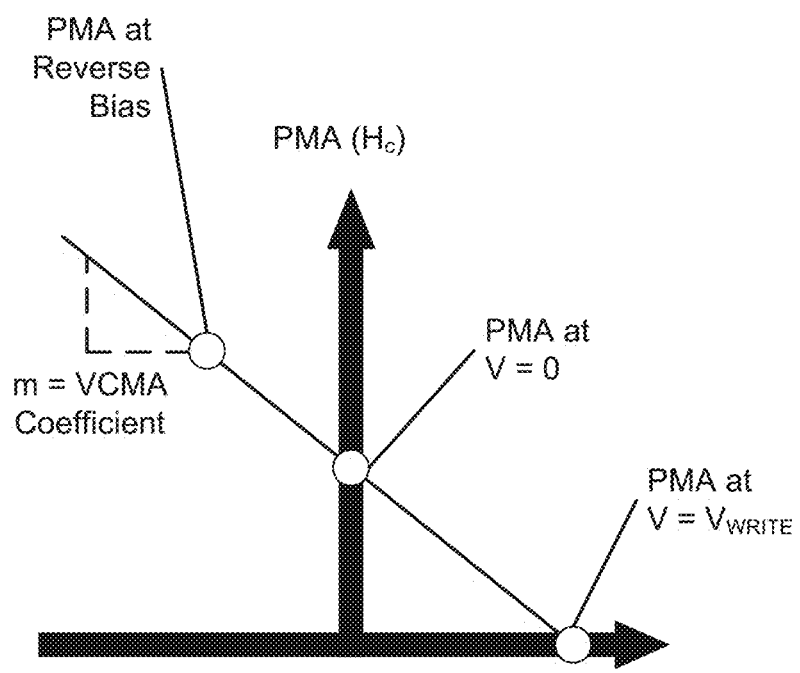
FIG. 1 conceptually illustrates the voltage dependence of the PMA via the VCMA effect in accordance with an embodiment of the invention.

FIG. 1 conceptually illustrates the voltage dependence of the PMA via the VCMA effect in accordance with an embodiment of the invention. As shown, under zero bias condition (V=0), the PMA of the MEJ is at a resting value $H_C$, which can hold the state of the MEJ. By applying $V_{WRITE}$, the PMA can be reduced to allow precessional switching between the two states. Conversely, a bias of the opposite polarity can increase the PMA. The slope m of the PMA with respect to voltage is proportional to the VCMA coefficient. With the correct selection of voltage polarity, the PMA can be reduced, which lowers the energy barrier of the free layer. The lowered energy barrier can cause a precessional motion of magnetization that can be observed via a resistance oscillation in the device. As the applied pulse is removed at the end of the write operation, the PMA returns to its original value at zero bias, retaining the written state.

Figure 2A:
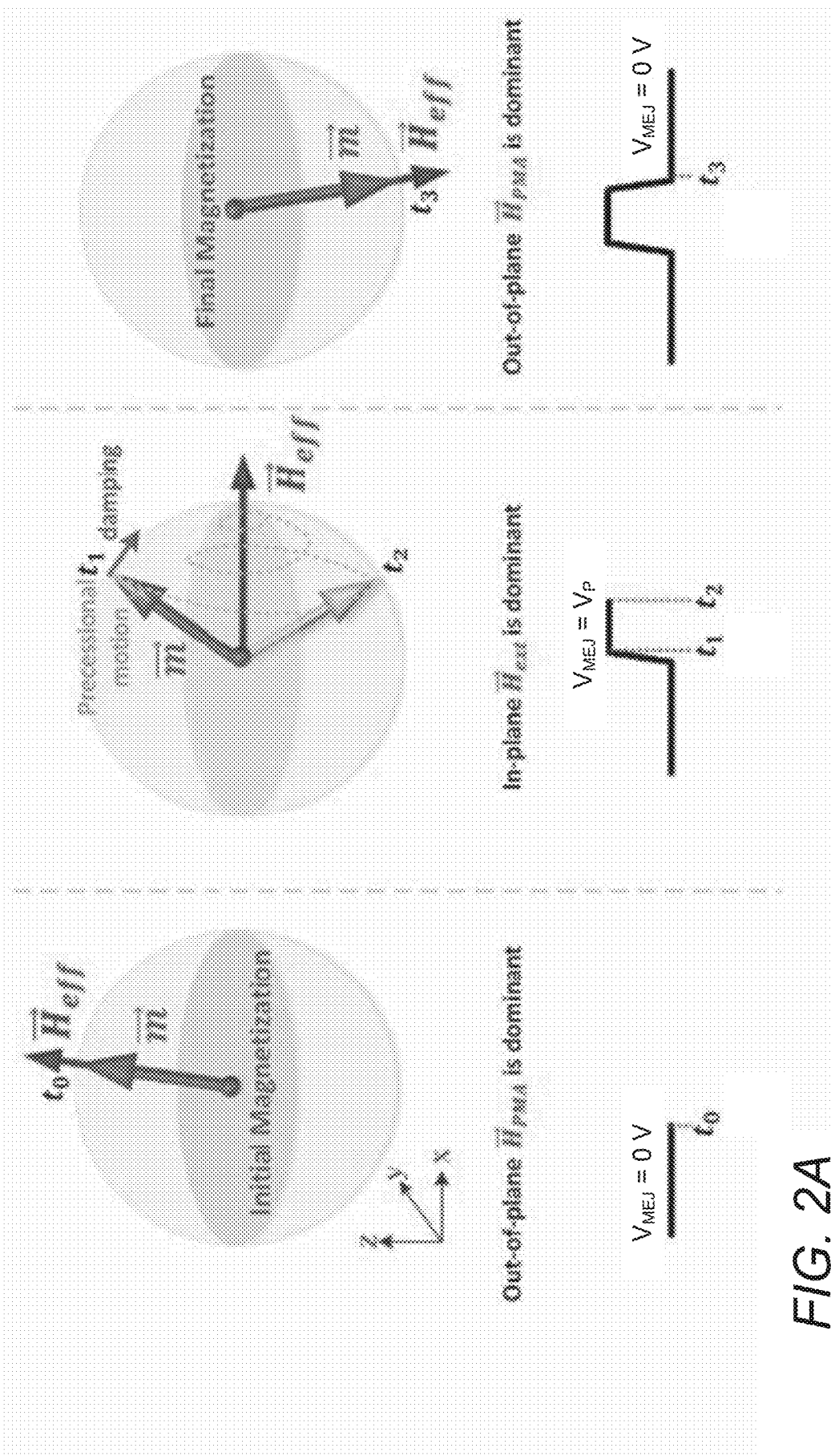
FIGS. 2A and 2B conceptually illustrate a write process and a graph depicting the associated energy barrier of an MEJ in accordance with an embodiment of the invention.
Figure 2B:
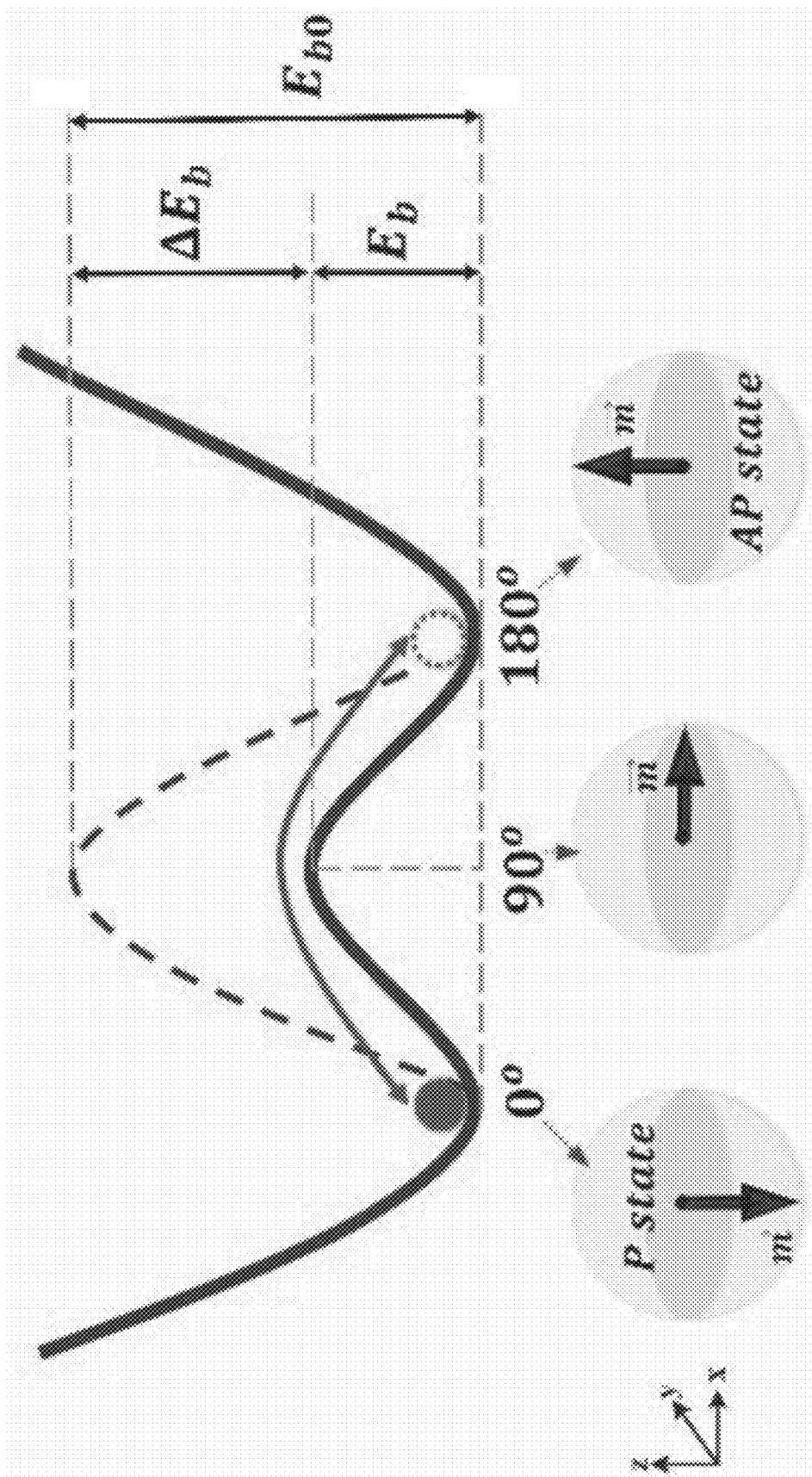

FIGS. 2A and 2B conceptually illustrate a write process and a graph depicting the associated energy barrier of an MEJ in accordance with an embodiment of the invention. FIG. 2A shows three time periods during a write process of the MEJ, while FIG. 2B illustrates the change in the energy barrier. In the first time period leading up to $t_0$, there is no applied voltage ($V_{MTJ}$=0 V). The device is in its resting state and out-of-plane $\vec{H}_{PMA}$ is dominant. As shown, in the initial magnetization state, the magnetic field $\vec{H}_{eff}$ and moment $\vec{m}$ is in a particular direction. In this state, the associated energy barrier is at $E_{b0}$, as shown in FIG. 2B. At time period $t_1$ through $t_2$, a voltage VP is applied across the device, which reduces the PMA. As a result, the energy barrier is reduced to $E_b$, and In-plane $\vec{H}$ext is dominant. This allows for precessional switching, or oscillation, between the two states of the MEJ. Once the MEJ state has successfully switched, the applied voltage can be removed ($V_{MTJ}$=0 V) to restore the energy barrier to $E_{b0}$, which stops the precessional motion. This is shown at time t3. In the final magnetization state, magnetic field $\vec{H}_{eff}$ and moment $\vec{m}$ are in a different direction compared to the initial magnetization state.

Since the VCMA driven precessional motion can cause the device resistance to oscillate between the two possible states (high and low), the switching probability can depend on the width of the write pulse. In many embodiments, the write pulse width is approximately equal to half of the resonant period. Such a configuration can ensure that the device successfully changes state. The magnetic moment becomes stabilized and aligned with its easy axis via damping and weak precessional motion right after the removal of the applied voltage pulse. Typically, the required time to make the device stable is a function of the magnitude of the PMA at the end of the write pulse. Since the device is still weakly precessing at the end of the write process (subsequent to removal of the voltage pulse), the device can be vulnerable to noise, such as but not limited to thermal noise. This effect can cause the MEJ to undergo undesired switching if the PMA at zero bias is not high enough, which requires more time to stabilize the magnetic moment via the weak precessional motion. Furthermore, subsequent write attempts can experience a different write probability if the oscillations of the resistance (even after a successful write event) have not yet fully been damped out.

Figure 3A:
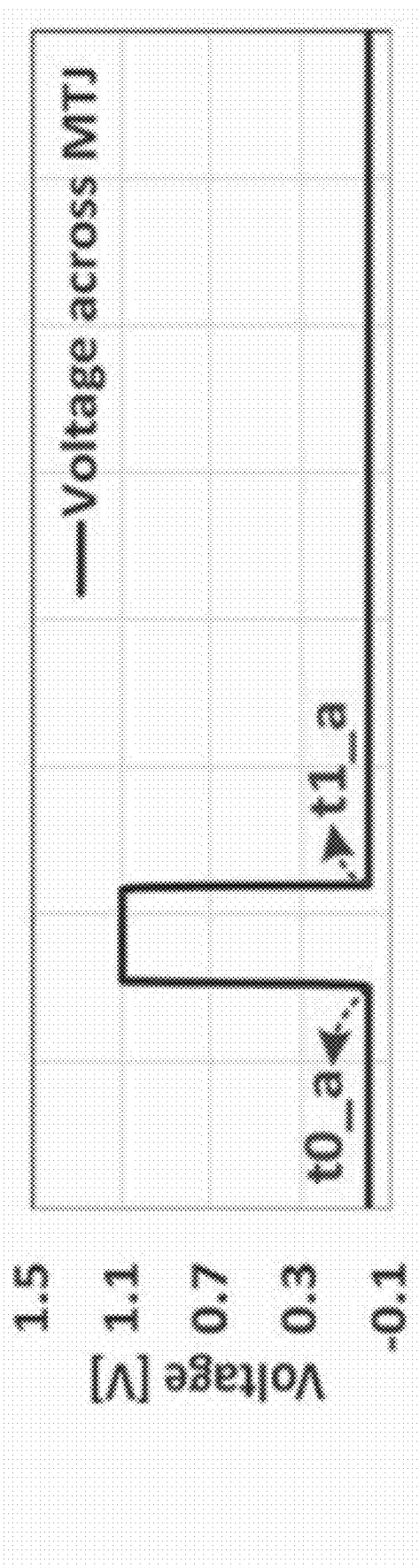
FIGS. 3A and 3B conceptually illustrate the oscillations of the resistance of an MTJ after the removal of an applied voltage in accordance with an embodiment of the invention.
Figure 3B:
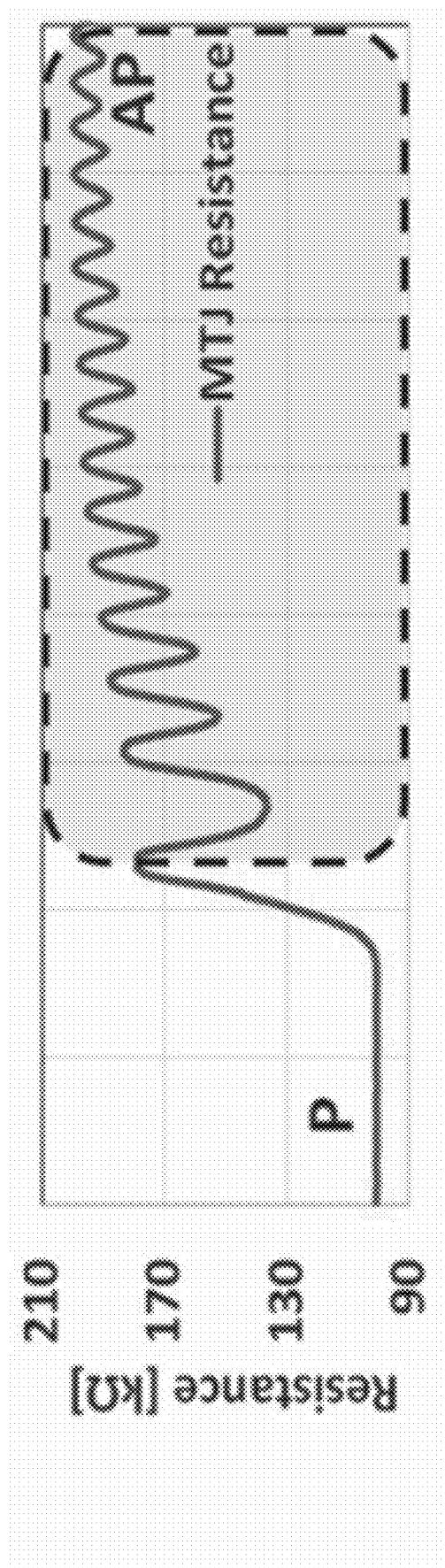

FIGS. 3A and 3B conceptually illustrate the oscillations of the resistance of an MTJ after the removal of an applied voltage in accordance with an embodiment of the invention. FIG. 3A is a graph illustrating an applied voltage across an MTJ with respect to time. As shown, a voltage pulse is applied across the MTJ at time $t_{0\_a}$, which can allow for switching. The voltage pulse is then removed at time $t_{1\_a}$. FIG. 3B is a graph showing the MTJ resistance as a function of time during the time period shown in FIG. 3A. As shown, the resistance is still weakly oscillating after the removal of the applied voltage at time $t_{1\_a}$. During this period, the device can be vulnerable to noise, which can cause the device to switch back to its previous state.

Write errors can be addressed using a variety of different mechanisms and combinations of such mechanisms. Combination of mechanisms can allow for a compounded effect in some applications. In many embodiments, write errors can be addressed through increasing the PMA at the end of the write pulse. In some embodiments, word line pulse ("WLP") circuit schemes are implemented for reducing WER. In several embodiments, the writing scheme is implemented to improve the write pulse shape in order to reduce WER. For example, WLP schemes can create an improved square shaped write pulse across a voltage-controlled MTJ, which can improve switching probability, and minimize the area overhead (e.g., driver size). U.S. patent application Ser. No. 15/636,568 ("the '568 patent application") to Hochul Lee discusses a set of WLP circuit techniques for reducing WER in MeRAM applications. The disclosure of the U.S. patent application Ser. No. 15/636,568 is hereby incorporated by reference in its entirety.

WLP schemes such as those described above can be implemented to create an improved square shaped write pulse, which is accompanied by an improved pulse slew rate. This pulse sharpening, or edge sharpening, effect can be further refined with RVP schemes. In some embodiments, an RVP scheme is implemented by applying a voltage pulse of a given polarity across the MEJ bit, which can reduce the perpendicular magnetic anisotropy ("PMA") and the magnetic coercivity of the free layer of the MEJ and cause the magnetization of the free layer of the MEJ to change direction. A voltage of opposite polarity can be applied across the device at the end of the first voltage pulse. This RVP scheme can increase the falling slope of the write voltage across the MEJ. Since precessional movement does not stop immediately at the end of the write pulse, a pulse of the opposite polarity applied on the MEJ for a short duration after removing the previously applied positive pulse can help secure the written state and avoid undesired switching by increasing PMA after the write pulse. As a result, WER can be reduced.

Due to the resulting lower WER, the RVP scheme can reduce the total number of write attempts to achieve the same bit error rate ("BER"). The WER can depend on the timing and amplitude of the pulse as well as the rising and falling slope of the pulse. If the WER is high, multiple write attempts are required to decrease the total error rate of a bit. Each write attempt reduces the number of errors in a bit by the WER, resulting in a BER that is equal to the WER to the power of write attempts (BER=WER$^{WRITE\ ATTEMPTS}$). Different applications can require different BER. In embedded memory applications, a BER of $10^{-9}$ is typically desirable. RVP schemes and other writing schemes along with fundamental MEJ structures and their operating principles are discussed below in further detail.

Fundamental Magnetoelectric Junction Structures

A fundamental MEJ structure typically includes a ferromagnetic ("FM") fixed layer, a FM free layer that has a uniaxial anisotropy (for simplicity, the terms "FM fixed layer" and "fixed layer" will be considered equivalent throughout this application, unless otherwise stated; similarly, the terms "FM free layer", "ferromagnetic free layer," "free layer that has a uniaxial anisotropy", and "free layer" will also be considered equivalent throughout this application, unless otherwise stated), and a dielectric layer separating the FM fixed layer and FM free layer. Generally, the FM fixed layer has a fixed magnetization direction—i.e., the direction of magnetization of the FM fixed layer does not change during the normal operation of the MEJ. Conversely, the FM free layer can adopt a magnetization direction that is either substantially parallel with or antiparallel with the FM fixed layer—i.e., during the normal operation of the MEJ, the direction of magnetization can be made to change. For example, the FM free layer may have a magnetic uniaxial anisotropy, whereby it has an easy axis that is substantially aligned with the direction of magnetization of the FM fixed layer. The easy axis refers to the axis, along which the magnetization direction of the layer prefers to align. In other words, an easy axis is an energetically favorable direction (axis) of spontaneous magnetization that is determined by various sources of magnetic anisotropy including, but not limited to, magnetocrystalline anisotropy, magnetoelastic anisotropy, geometric shape of the layer, etc. Relatedly, an easy plane is a plane whereby the direction of magnetization is favored to be within the plane, although there is no bias toward a particular axis within the plane. The easy axis and the direction of the magnetization of the fixed layer can be considered to be 'substantially aligned' when—in the case where the magnetization direction of the free layer conforms to the easy axis—the underlying principles of magnetoresistance take effect and result in a distinct measurable difference in the resistance of the MEJ as between when the magnetization directions of the FM layers are substantially parallel relative to when they are substantially antiparallel, e.g. such that two distinct information states can be defined. Similarly, the magnetization directions of the fixed layer and the free layer can be considered to be substantially parallel/antiparallel when the underlying principles of magnetoresistance take effect and result in a distinct measurable difference in the resistance of the MEJ as between the two states (i.e., substantially parallel and substantially antiparallel).

VCMA phenomena can be relied on in switching the FM free layer's characteristic magnetization direction—i.e., the MEJ can be configured such that the application of a potential difference across the MEJ can reduce the coercivity of the free layer, which can allow the free layer's magnetization direction to be switched more easily. For example, with a reduced coercivity, the FM free layer can be subject to magnetization that can make it substantially parallel with or substantially antiparallel with the direction of the magnetization for the FM fixed layer. A more involved discussion regarding the general operating principles of an MEJ is presented in the following section.

Notably, the magnetization direction, and the related characteristics of magnetic anisotropy, can be established for the FM fixed and FM free layers using any suitable method. For instance, the shapes of the constituent FM fixed layer, FM free layer, and dielectric layer, can be selected based on desired magnetization direction orientations. For example, implementing FM fixed, FM free, and dielectric layers that have an elongated shape (e.g., an elliptical cross-section) may tend to induce magnetic anisotropy that is in the direction of the length of the elongated axis—i.e., the FM fixed and FM free layers will possess a tendency to adopt a direction of magnetization along the length of the elongated axis. In other words, the direction of the magnetization is 'in-plane'. Alternatively, where it is desired that the magnetic anisotropy have a directional component that is perpendicular to the FM fixed and FM free layers (i.e., 'out-of-plane'), the shape of the layers can be made to be symmetrical, e.g. circular, and further the FM layers can be made to be thin. In this case, while the tendency of the magnetization to remain in-plane may still exist, it may not have a preferred directionality within the plane of the layer. Because the FM layers are relatively thinner, the anisotropic effects that result from interfaces between the FM layers and any adjacent layers, which tend to be out-of-plane, may tend to dominate the overall anisotropy of the FM layer. Alternatively, a material may be used for the FM fixed or free layers which has a bulk perpendicular anisotropy—i.e., an anisotropy originating from its bulk (volume) rather than from its interfaces with other adjacent layers. The FM free or fixed layers may also consist of a number of sub-layers, with the interfacial anisotropy between individual sub-layers giving rise to an effective bulk anisotropy to the material as a whole. Additionally, FM free or fixed layers may be constructed which combine these effects, and for example have both interfacial and bulk contributions to perpendicular anisotropy. Of course, any suitable methods for imposing magnetic anisotropy can be implemented in accordance with many embodiments of the invention.

While MEJs demonstrate much promise, their potential applications continue to be explored. For example, U.S. Pat. No. 8,841,739 (the '739 patent) to Khalili Amiri et al. discloses DIOMEJ cells that utilize diodes (e.g. as opposed to transistors) as access devices to MEJs. As discussed in the '739 patent, using diodes as access devices for MEJs can confer a number of advantages and thereby make the implementation of MEJs much more practicable. The disclosure of the '739 patent is hereby incorporated by reference in its entirety, especially as it pertains to implementing diodes as access devices for MEJs. Furthermore, U.S. Pat. No. 9,099,641 ("the '641 patent") to Khalili Amiri et al. discloses MEJ configurations that demonstrate improved writeability and readability, and further make the implementation of MEJs more practicable. The disclosure of the '641 patent is hereby incorporated by reference in its entirety, especially as it pertains to MEJ configurations that demonstrate improved writeability and readability. Additionally, U.S. patent application Ser. No. 14/681,358 ("the '358 patent application") to Qi Hu discloses implementing MEJ configurations that incorporate piezoelectric materials to strain the respective MEJs during operation, and thereby improve performance. The disclosure of the '358 patent application is hereby incorporated by reference in its entirety, especially as it pertains to MEJ configurations that incorporate elements configured to strain the respective MEJs during operation, and thereby improve performance.

Figure 4A:
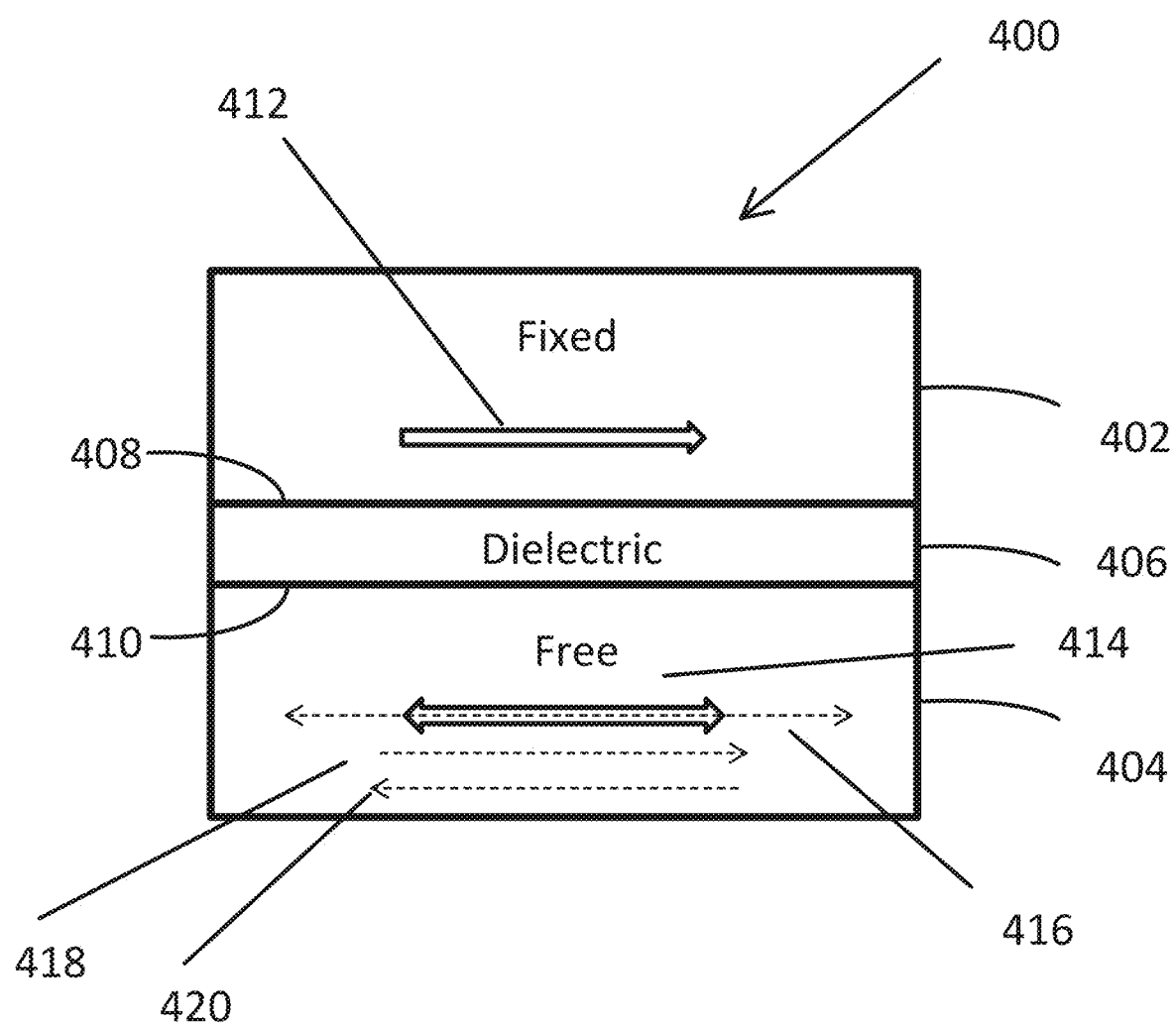
FIG. 4A conceptually illustrates an MEJ whereby the FM fixed layer and the FM free layer are separated by, and directly adjoined to, a dielectric layer in accordance with an embodiment of the invention.
Figure 4B:
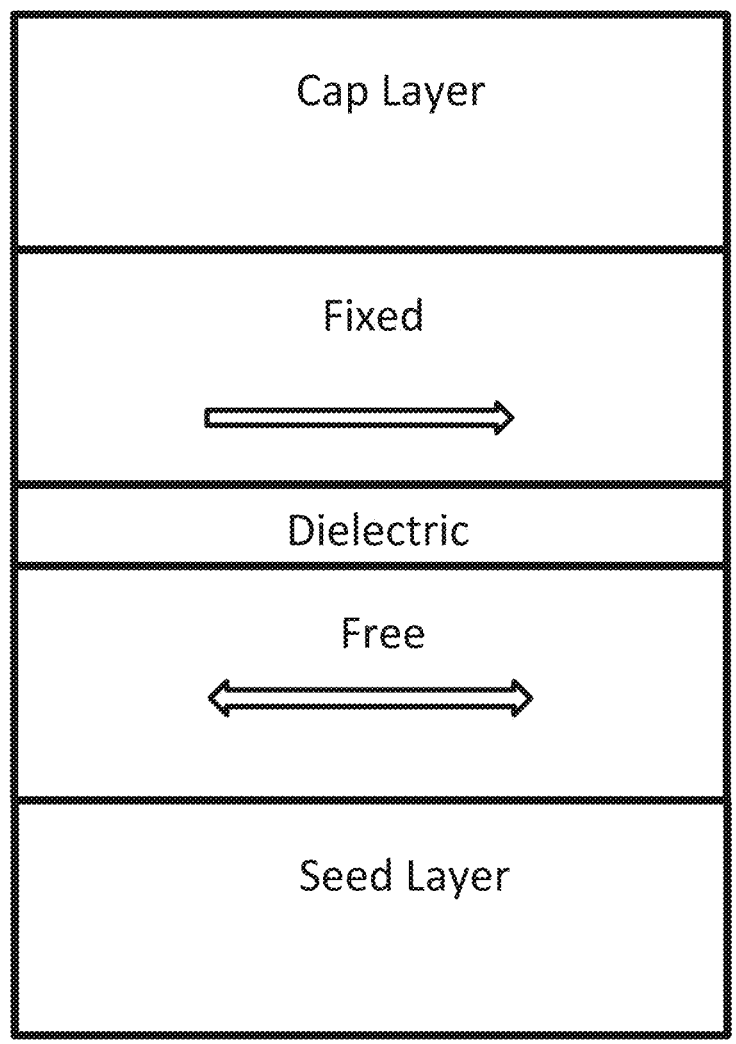
FIG. 4B conceptually illustrates an MEJ with constituent cap/seed layers in accordance with an embodiment of the invention.

FIG. 4A conceptually illustrates an MEJ whereby the FM fixed layer and the FM free layer are separated by, and directly adjoined to, a dielectric layer. In particular, in the illustration, the MEJ 400 includes an FM fixed layer 402 that is adjoined to a dielectric layer 406, thereby forming a first interface 408; the MEJ further includes an FM free layer 404 that is adjoined to the dielectric layer 406 on an opposing side of the first interface 408, and thereby forms a second interface 410. The MEJ 400 has an FM fixed layer 402 that has a magnetization direction 412 that is in-plane, and depicted in the illustration as being from left to right. Accordingly, the FM free layer is configured such that it can adopt a magnetization direction 414 that is either parallel with or antiparallel with the magnetization direction of the FM fixed layer. For reference, the easy axis 416 is illustrated, as well as a parallel magnetization direction 418, and an antiparallel magnetization direction 420. Additional contacts (capping or seed materials, or multilayers of materials, not shown in FIG. 4A) may be attached to the FM free layer 404 and the FM fixed layer 402, thereby forming additional interfaces. FIG. 4B conceptually illustrates an MEJ and depicts the constituent cap/seed layers. The contacts can both contribute to the electrical and magnetic characteristics of the device by providing additional interfaces, and can also be used to apply a potential difference across the device. Additionally, it should of course be understood that MEJs can include metallic contacts that can allow them to interconnect with other electrical components.

Importantly, by appropriately selecting the materials, the MEJ can be configured such that the application of a potential difference across the FM fixed layer and the FM free layer can modify the magnetic anisotropy, and correspondingly reduce the coercivity, of the FM free layer. For example, whereas in FIGS. 4A and 4B, the magnetization direction of the FM free layer is depicted as being in-plane, the application of a voltage may distort the magnetization direction of the FM free layer such that it includes a component that is at least partially out of plane. The particular dynamics of the modification of the magnetic anisotropy will be discussed below in the section entitled "General Principles of MEJ Operation." Suitable materials for the FM layers such that this effect can be implemented include iron, nickel, manganese, cobalt, FeCoB, FeGaB, FePd, FePt; further, any compounds or alloys that include these materials may also be suitable. Suitable materials for the dielectric layer include MgO and $Al_2O_3$. Of course, it should be understood that the material selection is not limited to those recited—any suitable FM material can be used for the FM fixed and free layers and any suitable material can be used for the dielectric layer. It should also be understood that each of the FM free layer, FM fixed layer, and dielectric layer may consist of a number of sub-layers, which acting together provide the functionality of the respective layer.

Figure 5:
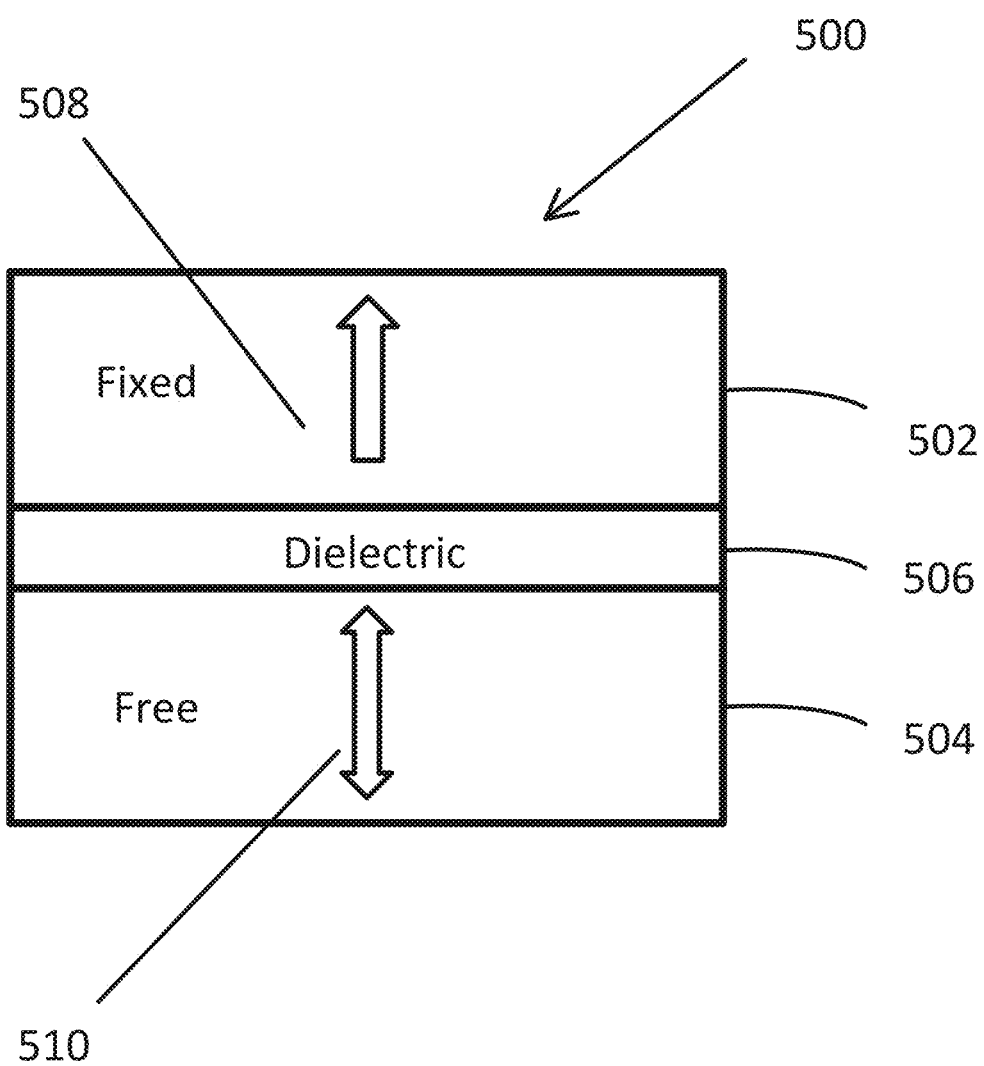
FIG. 5 conceptually illustrates an MEJ whereby the orientation of the magnetization directions is perpendicular to the plane of the constituent layers in accordance with an embodiment of the invention.

FIG. 5 conceptually illustrates an MEJ whereby the orientation of the magnetization directions is perpendicular to the plane of the constituent layers ("perpendicular magnetic anisotropy"). In particular, the MEJ 500 is similarly configured to that seen in FIG. 4A, with an FM fixed layer 502 and an FM free layer 504 adjoined to a dielectric layer 506. However, unlike the MEJ in FIG. 4A, the magnetization directions of the FM fixed and FM free layers, 508 and 510 respectively, are oriented perpendicularly to the layers of the MEJ. Additional contacts (capping or seed materials, or multilayers of materials, not shown) may be attached to the FM free layer 504 and the FM fixed layer 502, thereby forming additional interfaces. The contacts both contribute to the electrical and magnetic characteristics of the device by providing additional interfaces, and can also be used to apply a potential difference across the device. It should also be understood that each of the FM free layer, FM fixed layer, and dielectric layer may consist of a number of sub-layers, which acting together provide the functionality of the respective layer.

Of course, it should be understood that the direction of magnetization for the FM layers can be in any direction, as long as the FM free layer can adopt a direction of magnetization that is either substantially parallel with or antiparallel with the direction of magnetization of the FM fixed layer. For example, the direction of magnetization can include both in-plane and out-of-plane components.

In many instances, an MEJ includes additional adjunct layers that function to facilitate the operation of the MEJ. For example, in many instances, the FM free layer includes a capping or seed layer, which can (1) help induce greater electron spin perpendicular to the surface of the layer, thereby increasing its perpendicular magnetic anisotropy, and/or (2) can further enhance the sensitivity to the application of an electrical potential difference. In general, the seed/cap layers can beneficially promote the crystallinity of the ferromagnetic layers. The seed layer can also serve to separate a corresponding ferromagnetic layer from an 'underlayer.' As will be discussed below, in many embodiments of the invention, the capping/seed layer includes one of: Hf, Mo, W, Ir, Bi, Re, and/or Au; the listed elements can be incorporated by themselves, in combination with one another, or in combination with more conventional materials, such as Ta, Ru, Pt, Pd. As will be discussed in greater detail below, seed and/or cap layers made in this way can confer a number of benefits to the MEJ structure.

Figure 6:
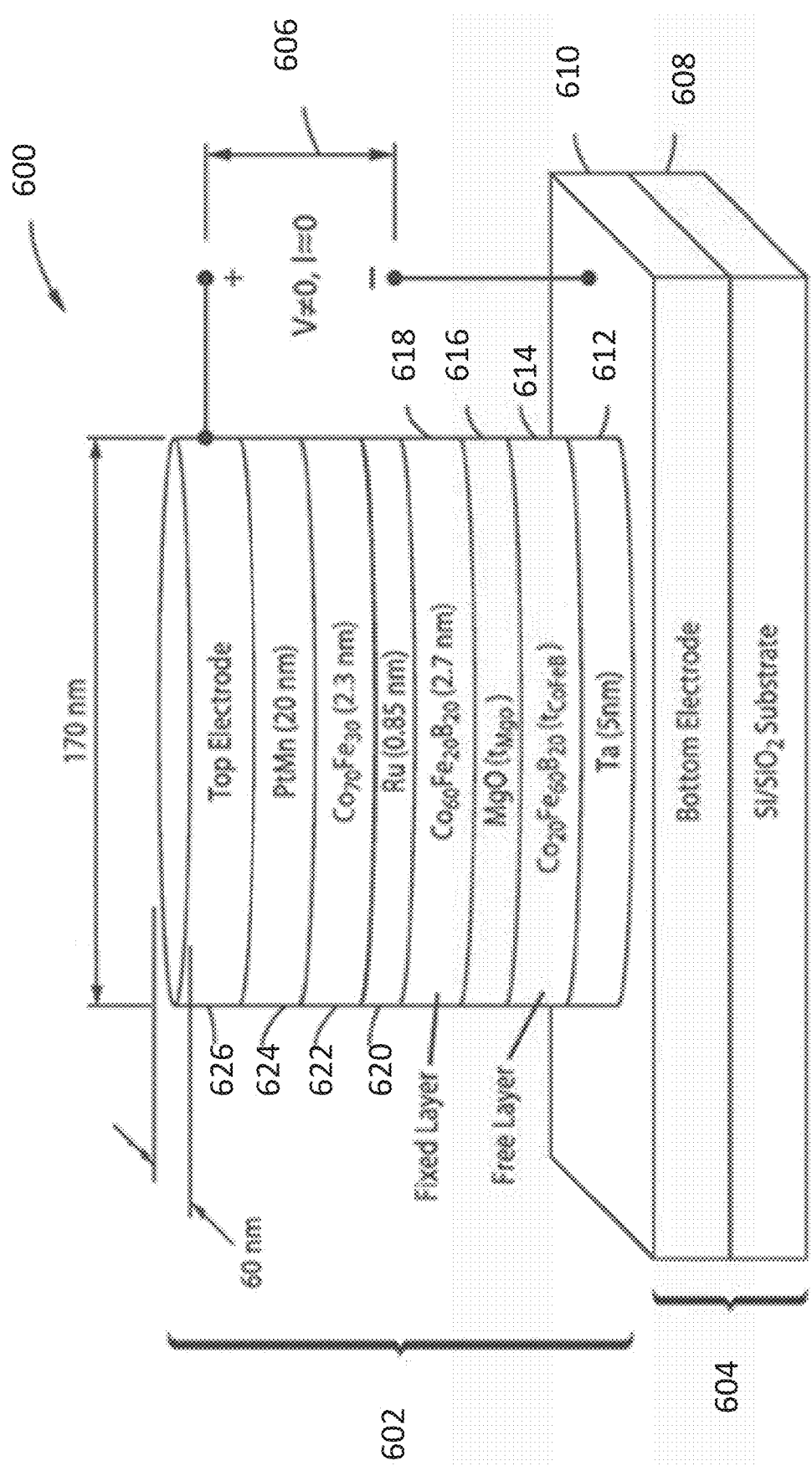
FIG. 6 conceptually illustrates an MEJ that includes multiple layers that work in aggregate to facilitate the functionality of the MEJ in accordance with an embodiment of the invention.

FIG. 6 conceptually illustrates an MEJ 600 that includes multiple layers that work in aggregate to facilitate the functionality of the MEJ 600. A pillar section 602 extends from a planar section 604. A voltage is shown being applied 606 between the top and bottom of the pillar. By way of example, the planar section 604 includes an Si/SiO$_2$ substrate 608 adjoined to a bottom electrode 610. In the illustrated embodiment, the pillar 602 includes the following layers in order: Ta 612 (e.g., 5 nm in thickness); a free layer 614 having an Fe-rich CoFeB material (e.g., Co$_{20}$Fe$_{60}$B$_{20}$ having a thickness generally ranging from, but not limited to, 0.8 nm-1.6 nm); a dielectric layer 616 having a dielectric oxide such as MgO or Al$_2$O$_3$ having a thickness of approximately, but not limited to, 0.8-1.4 nm); a FM fixed layer 618 having a CoFeB material (e.g., Co$_{60}$Fe$_{20}$B$_{20}$ having a thickness of approximately, but not limited to, 2.7 nm); a metal layer (e.g. Ru 620 having a thickness of approximately, but not limited to, 0.85 nm) to provide antiferromagnetic interlayer exchange coupling; an exchange-biased layer 622 of Co$_{70}$Fe$_{30}$ (e.g., thickness of approximately, but not limited to, 2.3 nm), the magnetization orientation of which is pinned by exchange bias using an anti-ferromagnetic layer 624 (e.g., PtMn, IrMn, or a like material having a thickness of approximately, but not limited to, 20 nm); and a top electrode 626. By way of example and not limitation, the pillar of the device depicted is in the shape of a 170 nm×60 nm elliptical nanopillar. In this illustration, Ta layer 612 is used as a seed layer to help induce a larger magnitude of perpendicular magnetic anisotropy and/or enhance the electric-field sensitivity of magnetic properties (such as anisotropy) in the FM free layer. It also acts as a sink of B atoms during annealing of the material stack after deposition, resulting in better crystallization of the FM free layer and thereby increasing the TMR and/or VCMA effect. Of course, any suitable materials can be used as a capping or seed layer 612; for example, as will be discussed in greater detail below, in many embodiments of the invention, the seed and/or cap layers include one of: Mo, W, Hf, Ir, Bi, Rh, and/or Au. More generally, any adjunct layers that can help facilitate the proper functioning of the MEJ can be implemented in an MEJ.

MEJs can also include a semi-fixed layer, which has a magnetic anisotropy that is altered by the application of a potential difference. In many instances, the characteristic magnetic anisotropy of the semi-fixed layer is a function of the applied voltage. For example, in many cases, the direction of the magnetization of the semi-fixed layer is oriented in the plane of the layer in the absence of a potential difference across the MEJ. However, when a potential difference is applied, the magnetic anisotropy is altered such that the magnetization includes a strengthened out-of-plane component. Moreover, the extent to which the magnetic anisotropy of the semi-fixed layer is modified as a function of applied voltage can be made to be less than the extent to which the magnetic anisotropy of the FM free layer is modified as a function of applied voltage. The incorporation of a semi-fixed layer can facilitate a more nuanced operation of the MEJ (to be discussed below in the section entitled "General Principles of MEJ Operation").

Figure 7A:
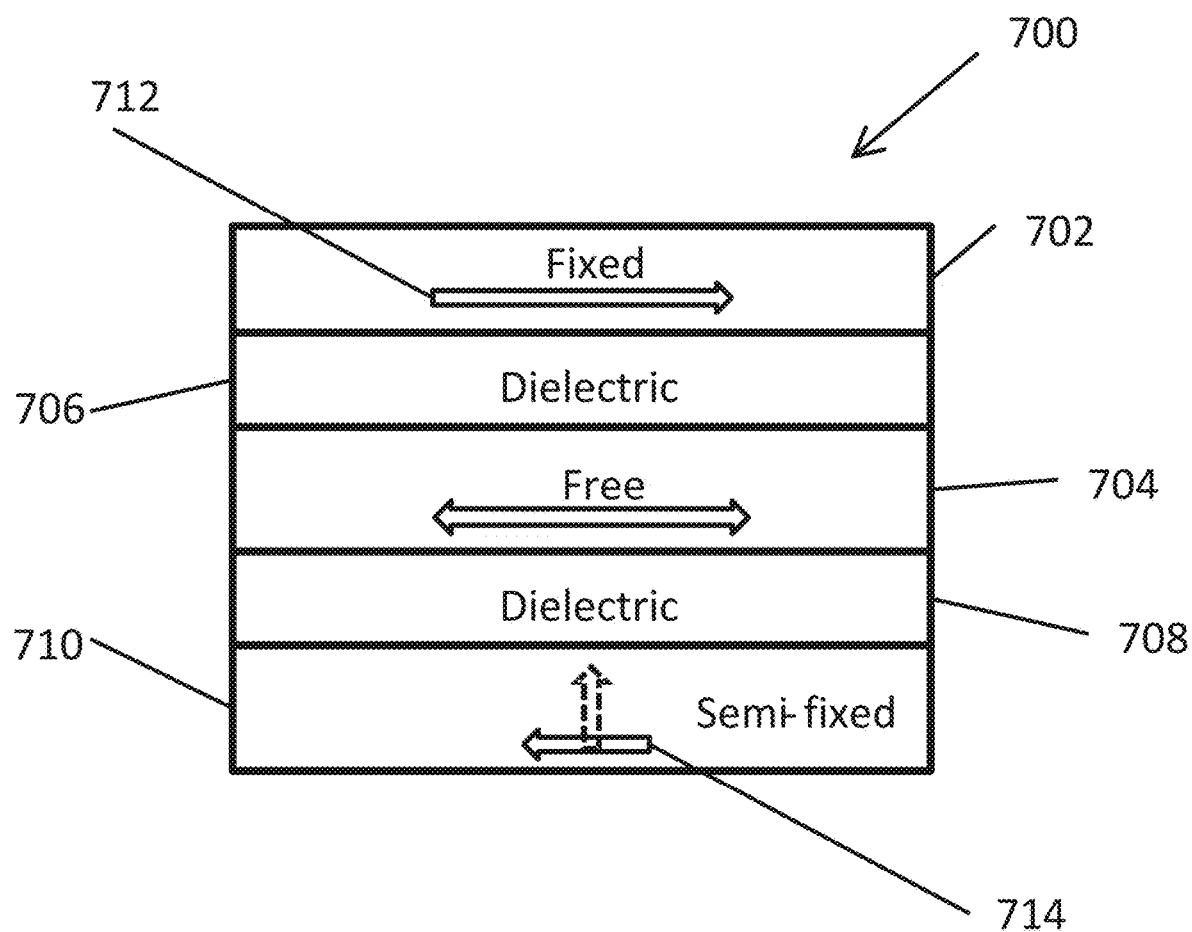
FIGS. 7A and 7B conceptually illustrate MEJs that include a semi-fixed layer in accordance with various embodiments of the invention.
Figure 7B:
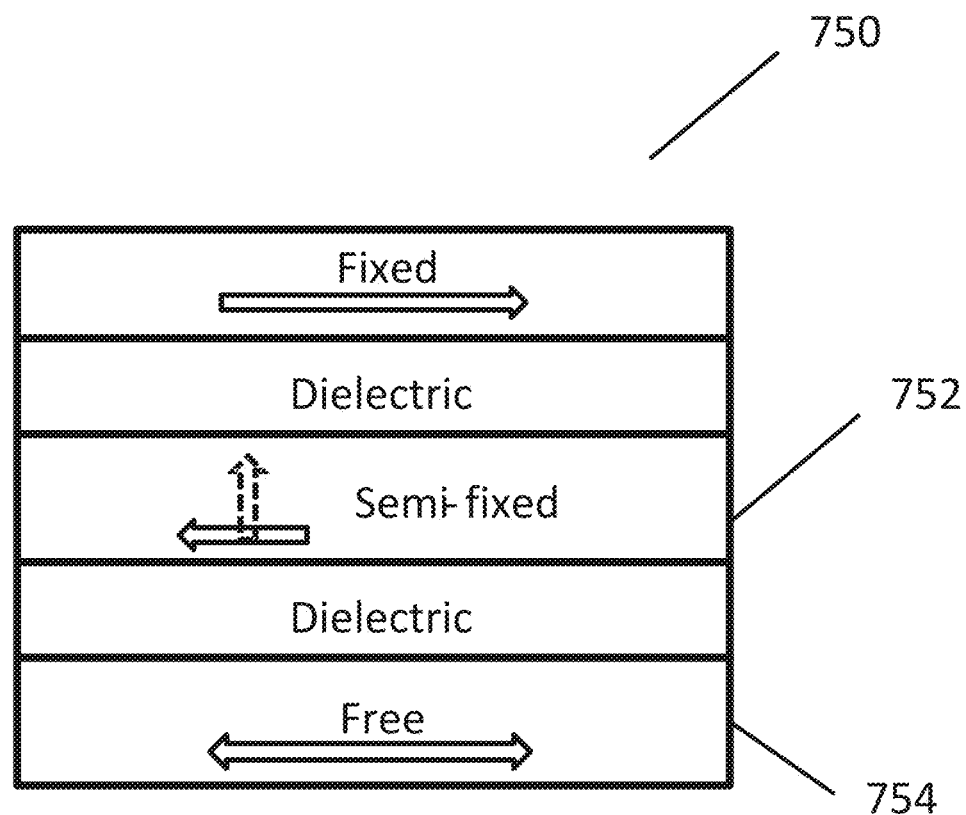

FIG. 7A conceptually illustrates an MEJ that includes a semi-fixed layer in accordance with an embodiment of the invention. In particular, the configuration of the MEJ 700 is similar to that depicted in FIG. 4A, insofar as it includes an FM fixed layer 702 and an FM free layer 704 separated by a dielectric layer 706. However, the MEJ 700 further includes a second dielectric layer 708 adjoined to the FM free layer 704 such that the FM free layer 704 is adjoined to two dielectric layers, 706 and 708 respectively, on opposing sides. Further, a semi-fixed layer 710 is adjoined to the dielectric layer. Typically, the direction of magnetization of the semi-fixed layer 714 is antiparallel with that of the FM fixed layer 712. As mentioned above, the direction of magnetization of the semi-fixed layer can be manipulated based on the application of a voltage. In the illustration, it is depicted that the application of a potential difference adjusts the magnetic anisotropy of the semi-fixed layer such that the strength of the magnetization along a direction orthogonal to the initial direction of magnetization (in this case, out of the plane of the layer) is developed. It should of course be noted that the application of a potential difference can augment the magnetic anisotropy in any number of ways; for instance, in some MEJs, the application of a potential difference can reduce the strength of the magnetization in a direction orthogonal to the initial direction of magnetization. Note also that in the illustration, the directions of magnetization are all depicted to be in-plane where there is no potential difference. However, of course it should be understood that the direction of the magnetization can be in any suitable direction. More generally, although a particular configuration of an MEJ that includes a semi-fixed layer is depicted, it should of course be understood that a semi-fixed layer can be incorporated within an MEJ in any number of configurations. For example, FIG. 7B conceptually illustrates an MEJ that includes a semi-fixed layer that is in a different configuration than that seen in 7A. In particular, the MEJ 750 is similar to that seen in FIG. 7A, except that the positioning of the semi-fixed layer 752 and the free layer 754 is inverted. In certain situations, such a configuration may be more desirable. The general principles of the operation of an MEJ are now discussed.

General Principles of MEJ Operation

MEJ operating principles—as they are currently understood—are now discussed. Note that embodiments of the invention are not constrained to the particular realization of these phenomena. Rather, the presumed underlying physical phenomena is being presented to inform the reader as to how MEJs are believed to operate. MEJs generally function to achieve two distinct states using the principles of magnetoresistance. As mentioned above, magnetoresistance principles regard how the resistance of a thin film structure that includes alternating layers of ferromagnetic and non-magnetic layers depends upon whether the ferromagnetic layers are in a substantially parallel or antiparallel alignment. Thus, an MEJ can achieve a first state where its FM layers have magnetization directions that are substantially parallel, and a second state where its FM layers have magnetization directions that are substantially antiparallel. MEJs further rely on voltage-controlled magnetic anisotropy phenomena. Generally, VCMA phenomena regard how the application of a voltage to a ferromagnetic material that is adjoined to an adjacent dielectric layer can impact the characteristics of the ferromagnetic material's magnetic anisotropy. For example, it has been demonstrated that the interface of oxides such as MgO with metallic ferromagnets such as Fe, CoFe, and CoFeB can exhibit a large perpendicular magnetic anisotropy which is furthermore sensitive to voltages applied across the dielectric layer, an effect that has been attributed to spin-dependent charge screening, hybridization of atomic orbitals at the interface, and to the electric field induced modulation of the relative occupancy of atomic orbitals at the interface. MEJs can exploit this phenomenon to achieve two distinct states. For example, MEJs can employ one of two mechanisms to do so: first, MEJs can be configured such that the application of a potential difference across the MEJ functions to reduce the coercivity of the FM free layer, such that it can be subject to magnetization in a desired magnetic direction, e.g. either substantially parallel with or antiparallel with the magnetization direction of the fixed layer; second, MEJ operation can rely on precessional switching (or resonant switching), whereby by precisely subjecting the MEJ to voltage pulses of precise duration, the direction of magnetization of the FM free layer can be made to switch.

In many instances, MEJ operation is based on reducing the coercivity of the FM free layer such that it can adopt a desired magnetization direction. With a reduced coercivity, the FM free layer can adopt a magnetization direction in any suitable way. For instance, the magnetization can result from: an externally applied magnetic field, the magnetic field of the FM fixed layer; the application of a spin-transfer torque ("STT") current; the magnetic field of a FM semi-fixed layer; the application of a current in an adjacent metal line inducing a spin-orbit torque ("SOT"); and any combination of these mechanisms, or any other suitable method of magnetizing the FM free layer with a reduced coercivity.

By way of example and not limitation, examples of suitable ranges for the externally applied magnetic field are in the range of 0 to 100 Oe. The magnitude of the electric field applied across the device to reduce its coercivity or bring about resonant switching can be approximately in the range of 0.1-2.0 V/nm, with lower electric fields required for materials combinations that exhibit a larger VCMA effect. The magnitude of the STT current used to assist the switching may be in the range of approximately 0.1-1.0 MA/cm$^2$.

Figure 8A:
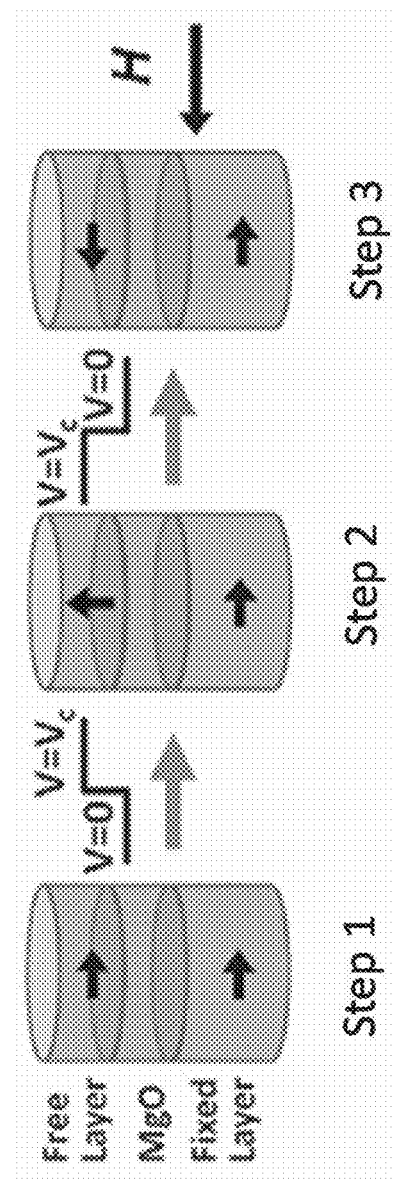
FIGS. 8A and 8B conceptually illustrate how the application of a potential difference can reduce the coercivity of the free layer in accordance with various embodiments of the invention.

FIG. 8A depicts how the application of a potential difference can reduce the coercivity of the free layer such that an externally applied magnetic field H can impose a magnetization switching on the free layer. In the illustration, in step 1, the FM free layer and the FM fixed layer have a magnetization direction that is substantially in plane; the FM free layer has a magnetization direction that is parallel with that of the FM fixed layer. Further, in Step 1, the coercivity of the FM free layer is such that the FM free layer is not prone to having its magnetization direction reversed by the magnetic field H, which is in a direction antiparallel with the magnetization direction of the FM fixed layer. However, a voltage $V_c$ is then applied, which results in step 2, where the voltage $V_c$ has magnified the perpendicular magnetization direction component of the free layer (out of its plane). Correspondingly, the coercivity of the FM free layer is reduced such that it is subject to magnetization by an in-plane magnetic field H. Accordingly, when the potential difference $V_c$ is removed, VCMA effects are removed and the magnetic field H, which is substantially anti-parallel to the magnetization direction of the FM fixed layer, causes the FM free layer to adopt a direction of magnetization that is antiparallel with the magnetization direction of the FM fixed layer. Hence, as the MEJ now includes an FM fixed layer and an FM free layer that have magnetization directions that are antiparallel, it reads out a second information state (resistance value) different from the first. In general, it should be understood that in many embodiments where the magnetization directions of the free layer and the fixed layer are substantially in-plane, the application of a voltage enhances the perpendicular magnetic anisotropy such that the FM free layer can be caused to adopt an out-of-plane direction of magnetization. Stated differently, the magneto-electric junction is configured such that when a potential difference is applied across the magnetoelectric junction, the magnetic anisotropy of the ferromagnetic free layer is altered such that the relative strength of the magnetic anisotropy along a second easy axis that is orthogonal to the first easy axis (which corresponds to the magnetization direction of the fixed layer), or the easy plane where there is no easy axis that is orthogonal to the first easy axis, as compared to the strength of the magnetic anisotropy along the first easy axis, is magnified or reduced for the duration of the application of the potential difference. The magnetization direction can thereby be made to switch. In general, it can be seen that by controlling the potential difference and the direction of an applied external magnetic field, an MEJ switch can be achieved.

Figure 8B:
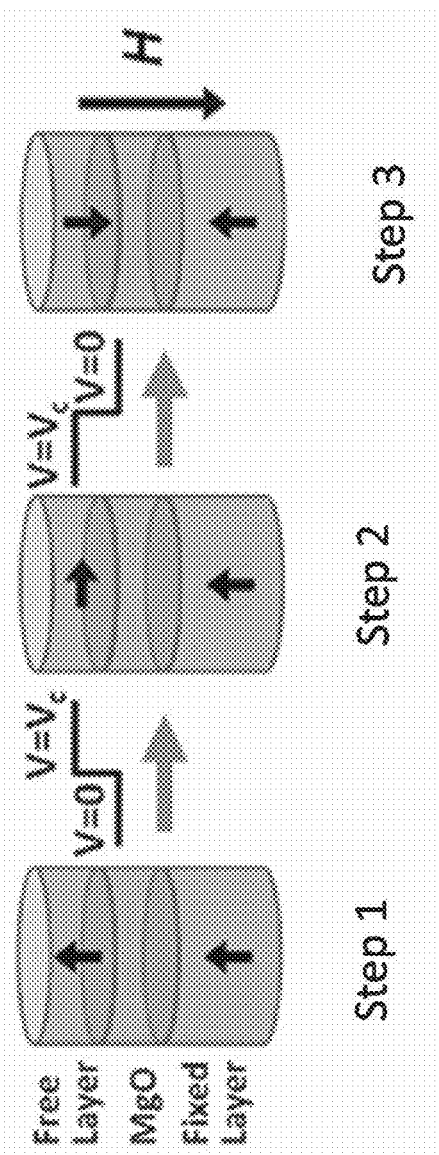

It should of course be understood that the direction of the FM fixed layer's magnetization direction need not be in-plane—it can be in any suitable direction. For instance, it can be substantially out of plane. Additionally, the FM free layer can include both in-plane and out-of-plane magnetic anisotropy directional components. FIG. 8B depicts a corresponding case relative to FIG. 8A when the FM fixed and FM free layers have magnetization directions that are perpendicular to the layers of the MEJ (out-of-plane). It is of course important, that an FM, magnetically anisotropic, free layer be able to adopt a magnetization direction that is either substantially parallel with an FM fixed layer, or substantially antiparallel with an FM fixed layer. In other words, when unburdened by a potential difference, the FM free layer can adopt a direction of magnetization that is either substantially parallel with or antiparallel with the direction of the FM fixed layer's magnetization, to the extent that a distinct measurable difference in the resistance of the MEJ that results from the principles of magnetoresistance as between the two states (i.e., parallel alignment vs. antiparallel alignment) can be measured, such that two distinct information states can be defined.

Note of course that the application of an externally applied magnetic field is not the only way for the MEJ to take advantage of reduced coercivity upon application of a potential difference. For example, the magnetization of the FM fixed layer can be used to impose a magnetization direction on the free layer when the free layer has a reduced coercivity. Moreover, an MEJ can be configured to receive a spin-transfer torque current when application of a voltage causes a reduction in the coercivity of the FM free layer. Generally, STT current is a spin-polarized current that can be used to facilitate the change of magnetization direction on a ferromagnetic layer. It can originate, for example, from a current passed directly through the MEJ device, such as due to leakage when a voltage is applied, or it can be created by other means, such as by spin-orbit-torques (e.g., Rashba or Spin-Hall Effects) when a current is passed along a metal line placed adjacent to the FM free layer. Accordingly, the spin orbit torque current can then help cause the FM free layer to adopt a particular magnetization direction, where the direction of the spin orbit torque determines the direction of magnetization. This configuration is advantageous over conventional STT-RAM configurations since the reduced coercivity of the FM free layer reduces the amount of current required to cause the FM free layer to adopt a particular magnetization direction, thereby making the device more energy efficient.

Figure 9:
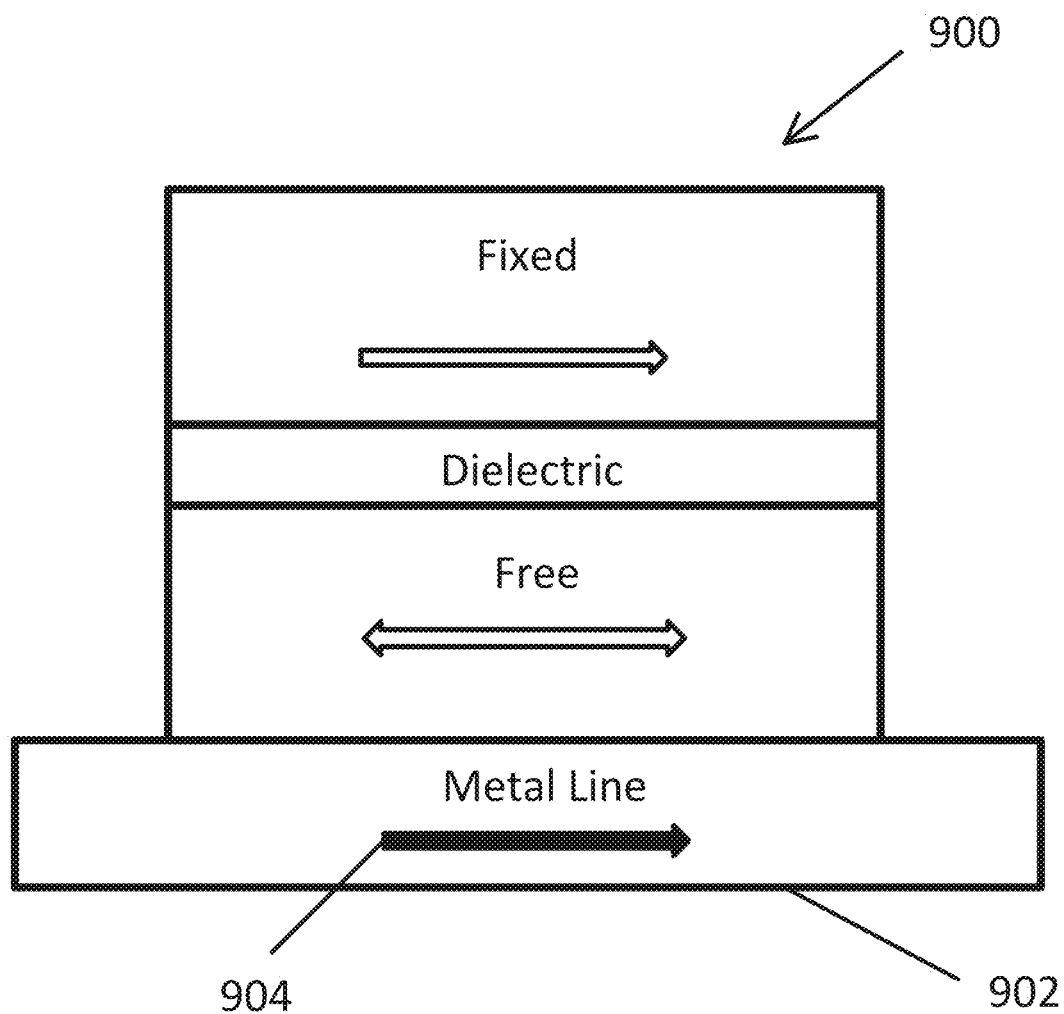
FIG. 9 conceptually illustrates using a metal line disposed adjacent to an FM free layer to generate spin-orbit torques that can impose a magnetization direction change on the FM free layer in accordance with an embodiment of the invention.

FIG. 9 depicts using a metal line disposed adjacent to an FM free layer to generate spin-orbit torques that can impose a magnetization direction change on the FM free layer. In particular, the MEJ 900 is similar to that seen in FIG. 4A, except that it further includes a metal line 902, whereby a current 904 can flow to induce spin-orbit torques, which can thereby help impose a magnetization direction change on the ferromagnetic free layer.

Additionally, in many instances, an MEJ cell can further take advantage of thermally assisted switching ("TAS") principles. Generally, in accordance with TAS principles, heating up the MEJ during a writing process reduces the magnetic field required to induce switching. Thus, for instance, where STT is employed, even less current may be required to help impose a magnetization direction change on a free layer, particularly where VCMA principles have been utilized to reduce its coercivity.

Moreover, the switching of MEJs to achieve two information states can also be achieved using voltage pulses. In particular, if voltage pulses are imposed on the MEJ for a time period that is one-half of the precession of the magnetization of the free layer, then the magnetization may invert its direction. Using this technique, ultrafast switching times (e.g., below 1 ns) can be realized; moreover, using voltage pulses as opposed to a current, makes this technique more energetically efficient as compared to the precessional switching induced by STT currents, as is often used in STT-RAM. However, this technique is subject to the application of a precise pulse that is half the length of the precessional period of the magnetization layer. The precessional period of the magnetization layer can be defined as the time it takes for the magnetization to undergo one cycle of oscillation. For instance, it has been observed that pulse durations in the range of 0.05 to 3 nanoseconds can reverse the magnetization direction. Additionally, the voltage pulse must be of suitable amplitude to cause the desired effect—e.g., reverse the direction of magnetization.

Based on this background, it can be seen that MEJs can confer numerous advantages relative to conventional MTJs. For example, they can be controlled using voltages of a single polarity—indeed, the '739 patent, incorporated by reference above, discusses using diodes, in lieu of transistors, as access devices to the MEJ, and this configuration is enabled because MEJs can be controlled using voltage sources of a single polarity.

Figure 10:
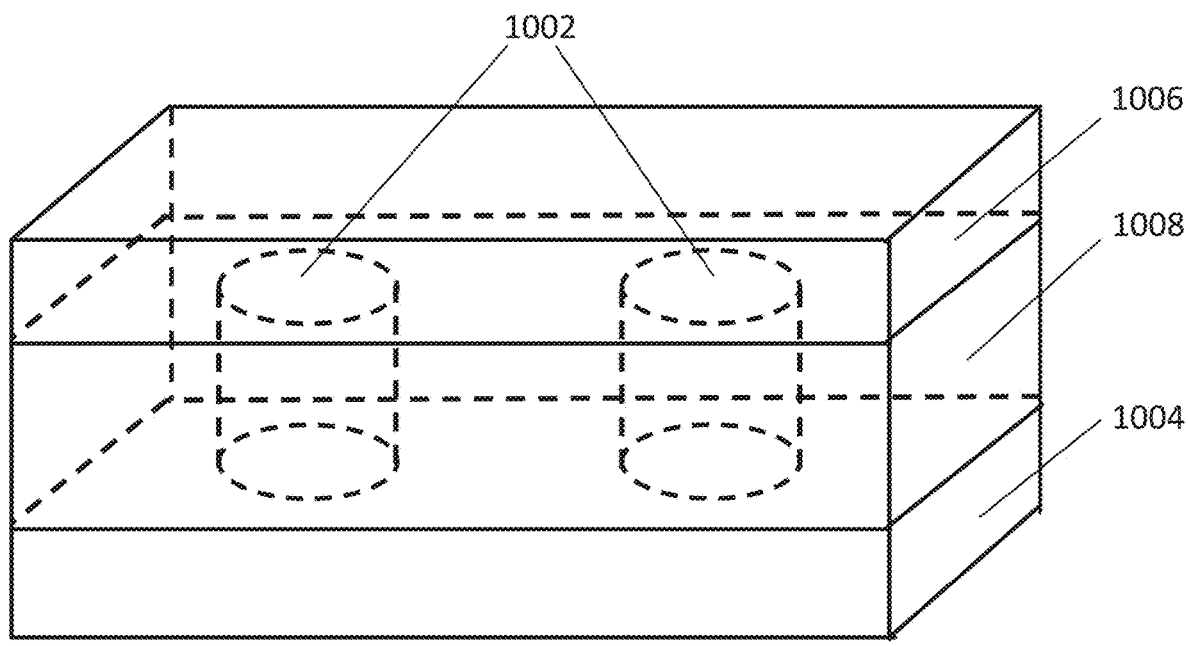
FIG. 10 conceptually illustrates the implementation of two MEJs that are housed within encapsulating layers and separated by field insulation in accordance with an embodiment of the invention.

Note that while the above discussion largely regards the operation of single MEJs, it should of course be understood that in many instances, a plurality of MEJs are implemented together. For example, the '671 patent application discloses MeRAM configurations that include a plurality of MEJs disposed in a cross-bar architecture. It should be clear that MEJ systems can include a plurality of MEJs in accordance with embodiments of the invention. Where multiple MEJs are implemented, they can be separated by field insulation, and encapsulated by top and bottom layers. Thus, for example, FIG. 10 depicts the implementation of two MEJs that are housed within encapsulating layers and separated by field insulation. In particular, the MEJs 1002 are encapsulated within a bottom layer 1004 and a top layer 1006. Field insulation 1008 is implemented to isolate the MEJs and facilitate their respective operation. It should of course be appreciated that each of the top and bottom layers can include one or multiple layers of materials/structures. As can also be appreciated, the field insulation material can be any suitable material that functions to facilitate the operation of the MEJs in accordance with embodiments of the invention. While a certain configuration for the implementation of a plurality of MEJs has been illustrated and discussed, any suitable configuration that integrates a plurality of MEJs can be implemented in accordance with embodiments of the invention.

RVP Writing Schemes

Various writing schemes can be implemented in MeRAM applications. In many embodiments, writing schemes are implemented to reduce WER in MeRAM applications. Write error in MeRAM is mainly caused by a degraded write pulse (e.g., slew rate and duration), and can limit its applications in high-speed memories. If WER is relatively high, multiple write operations are required to achieve an acceptable BER. As such, by reducing WER, less write operations are required for a given BER.

Figure 11:
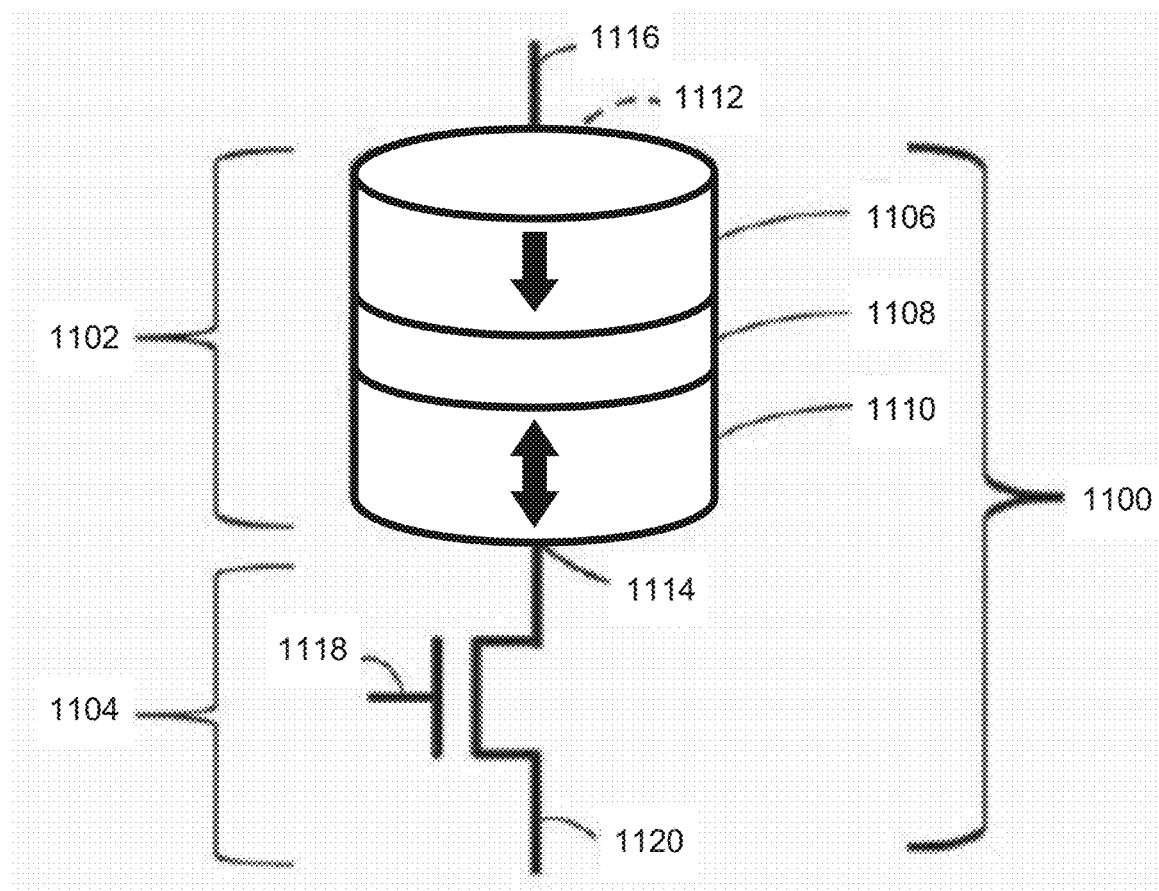
FIG. 11 conceptually illustrates a MeRAM bit-cell in accordance with an embodiment of the invention.

FIG. 11 conceptually illustrates a MeRAM bit-cell in accordance with an embodiment of the invention. As shown, the MeRAM cell 1100 includes an MEJ 1102 and an access transistor 1104. The MEJ 1 includes at least the following layers: a pinned layer ("PL") 1106; a tunnel barrier ("TB") 1108; and a magnetic free layer ("FL") 1110. The two terminals of the MEJ can be referred to as the top electrode ("TE") 1112 and the bottom electrode ("BE") 1114, respectively. From the bit-cell point of view, there are three electrical ports to read and write an MEJ: a bit line ("BL") 1116; a word line ("WL") 1118; and a source line ("SL") 1120. In the illustrated embodiment, the MEJ is configured to have a low resistance when the magnetic moments of the FL and PL are aligned along the same direction—i.e., in the parallel state (denoted as P). In the anti-parallel state (denoted as AP), the FL magnetization is aligned in the opposite direction to the PL, resulting in a high resistance. Although the above description refers to a structure with the FL on the bottom and other layers in a prescribed order, this ordering can vary from application to application. In a number of embodiments, this ordering is reversed. Depending on the specific ordering, the operation of the device can differ accordingly.

Conventional writing schemes in MeRAM applications can include applying a voltage pulse to the WL or the BL in order to generate the write pulse across the BE to the TE, which can decrease the PMA of the MEJ and allows precessional switching between the two states. The VCMA effect can modulate the PMA (hence free layer coercivity) under the electric bias condition (as shown in FIG. 1). It has been shown that a negative (positive) voltage across the perpendicularly magnetized MEJ increases (decreases) the coercivity of the free layer. By allowing the MEJ to precess, the MEJ can switch to the opposite state (as shown in FIG. 2).

In many embodiments, a reverse pulse scheme can be implemented in a MeRAM application to reduce WER. In some embodiments, the writing mechanism is implemented for a voltage controlled magnetoelectric tunnel junction, or MEJ, with an in-plane or perpendicular magnetization that is implemented as the storage element in a MeRAM cell. A reverse pulse scheme can be implemented with a write operation that includes a write voltage pulse along with a reverse pulse that increases the PMA at the end of the write pulse. For example, a write operation can be implemented by applying a voltage pulse of a given polarity across the MEJ bit, which can reduce the perpendicular magnetic anisotropy ("PMA") and the magnetic coercivity of the free layer of the MEJ and cause the magnetization of the free layer of the MEJ to change direction. A voltage of opposite polarity can be applied across the device at the end of the first voltage pulse. This RVP scheme can increase the falling slope of the write voltage across the MEJ. In a number of embodiments, a pulse of a polarity opposite the write pulse can be applied before the write operation to stabilize the bit state before the write operation.

To achieve low WER, the PMA can be modulated instantly to have a stable precessional trajectory. In a number of embodiments, the device is configured such that rising/ falling edges of the applied voltage are as sharp as possible. Since precessional movement does not stop immediately at the end of the write pulse (as shown in FIGS. 3A and 3B), a negative pulse (or a pulse of the opposite polarity from the BE to the TE) can be applied on the MEJ for a short duration after removing the previously applied positive pulse, which can enhance coercivity to secure the written state and avoid undesired switching. The scheme as described above can be important to VCMA-driven precessional switching, and may not be as critical in conventional methods used for switching magnetization in magnetic tunnel junctions, such as thermally activated switching driven by current and/or magnetic fields, since the time scales of such switching events are much longer than the oscillations of the magnetization considered in devices in accordance with various embodiments of the invention.

Figure 12:
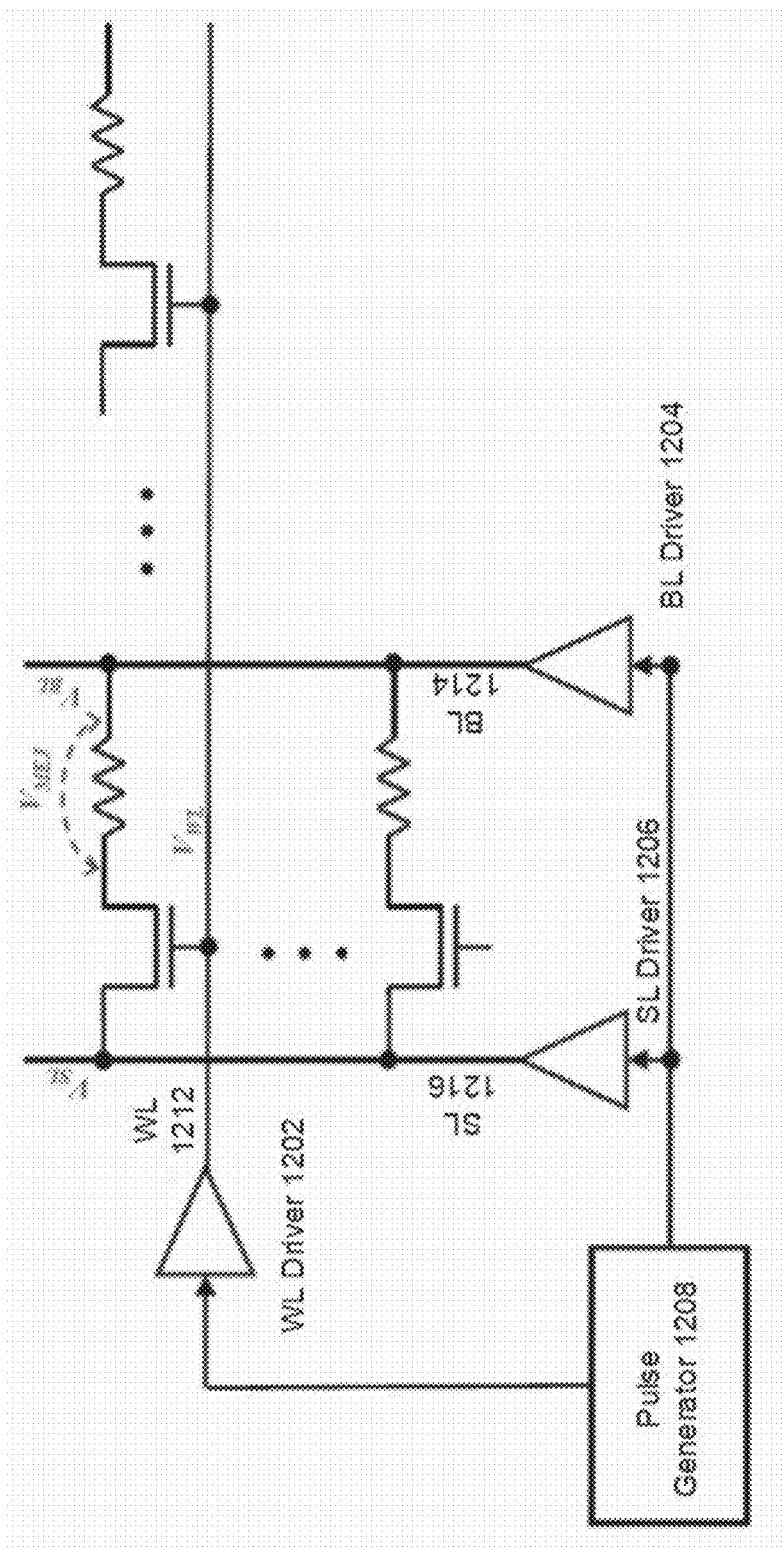
FIG. 12 conceptually illustrates a circuit diagram of MeRAM cells in accordance with an embodiment of the invention.

In many embodiments, the reverse pulse scheme utilizes the VCMA effect in reverse to increase the rising/falling slope(s), which can improve WER by engineering the control signals of the MeRAM. FIG. 12 conceptually illustrates a circuit diagram of MeRAM cells in accordance with an embodiment of the invention. In the illustrated embodiment, the WL Driver 1202, BL Driver 1204, and SL Driver 1206 are coupled to the WL 1212, the BL 1214, and the SL 1216, respectively. A number of MeRAM cells can share the BL and SL in the vertical direction, and another number of cells can share the WL in the horizontal direction to create an array of MeRAM cells. The controls can be engineered such that the write pulse, generated from the pulse generator 1208, is given from BL, SL, WL, or a combination of either (e.g., WL rise as the rising edge of the write pulse and BL fall as the falling edge of the write pulse). $V_{SL}$, $V_{WL}$, $V_{BL}$, and $V_{MEJ}$ describe the voltage at their respective component.

The reverse pulse can be applied using a variety of different methods. In many embodiments, the reverse pulse can be applied using any of the electrical ports of the MeRAM cells (i.e., WL, BL, or SL). FIGS. 13A-13C conceptually illustrate three examples of applying a reverse voltage on the MEJ after the write pulse in accordance with various embodiments of the invention. In the illustrated embodiments, a time graph of the voltages $V_{MEJ}$, $V_{WL}$, $V_{BL}$, and $V_{SL}$ are shown. The voltage across the MEJ ($V_{MEJ}$) is equal to the voltage at TE minus the voltage at BE ($V_{MEJ}=V_{TE}-V_{BE}$). In FIG. 13A, the reverse pulse is implemented by applying a voltage pulse to the SL at the end of the write pulse on the BL such that the voltage across the MEJ is of opposite polarity. In many embodiments, the rising edge of the SL coincides with the falling edge of the BL. The falling edge slope of the BL and the rising slope of the SL can add on the differential nodes of the device, which can increase the falling edge slope. As such, the falling edge slope on the device is greater than that of the falling edge slope on the BL. This method can be applied without the need for any boosted voltage, regulated voltage, or negative voltages. FIG. 13B shows applying a reverse voltage on the MEJ using the falling edge of the WL to capacitively couple to the nodes of the MEJ through the gate-to-source-capacitance. The coupling can create an instantaneous negative potential on the device, which then slowly leaks back to the ground potential. The WL can be decreased to below ground potential to increase the amount of coupling. In FIG. 13C, the reverse pulse is implemented by applying a negative voltage on the BL at the end of the write pulse. In some embodiments, the negative voltage is applied on the BL while the SL is kept at ground level. In other embodiments, the voltage level of the SL and the voltage applied on the BL are both positive with respect to ground. Although FIGS. 13A-13C illustrate three specific methods of applying a reverse pulse, any of a number of methods can be utilized to apply a reverse voltage on the MEJ after the write pulse. The combined application of two or more of the RVP implementations can provide additional gain in the effectiveness of such RVP schemes. For example, using the WL coupling in conjunction with SL pulse can provide a further increase in the falling slope as well as the level of the reverse pulse.

Although specific reverse pulse schemes for MeRAM applications are discussed above, a person having ordinary skill in the art would appreciate that any of a number of reverse pulse writing schemes can be implemented in accordance with embodiments of the invention. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

Optimization of Magnetic Torque

In addition to optimizing the magnetic trajectory (as discussed above), optimization of magnetic torque can also be utilized to enhance the performance of the device. In many embodiments, it is desirable that the precessional dynamics are cutoff at the maximum of the magnetic trajectory, $m_{z,max}$. As discussed above, this can be achieved by a sharp and strong increase in anisotropy at half of the precessional period, $t_{precess}$, which can be implemented through either a high slew rate or a negative voltage. However, the instantaneous change of anisotropy can result in large residual torque and, therefore, ringing of the magnetization after the write operation, which can make the device susceptible to noise and can result in undesirable switching (write errors). As such, the final torque at the end of the pulse during the write operation can greatly impact writing errors. In many cases, reducing the final torque can be important for lowering WER, while reducing initial torque can impact stochastic signal generation. Compared to trajectory optimization, torque optimization can achieve similar error rates with an additional ~43% improvement in ringing and 2.1× improvement in pulse variation tolerance. In addition, a ~37% improvement in energy and ~38% improvement in delay can be achieved for stochastic signal generation.

In many embodiments, the magnetic torque at $m_{z,max}$ is optimized to minimize ringing. In some cases, this translates to minimizing the magnetic torque at $m_{z,max}$. In several embodiments, an asymmetric pulse with an early, gradual ramp down of the voltage is utilized to minimize the magnetic torque at $m_{z,max}$. As the voltage slowly reduces (ramp down), the torque decreases and the precession slows down as the magnetization approaches $m_{z,max}$. An asymmetric ramp can be achieved using various methods, including but not limited to configurable driver sizes. In several embodiments, implementation of the asymmetric ramp does not require complex timing/regulator circuits.

Figure 14D:
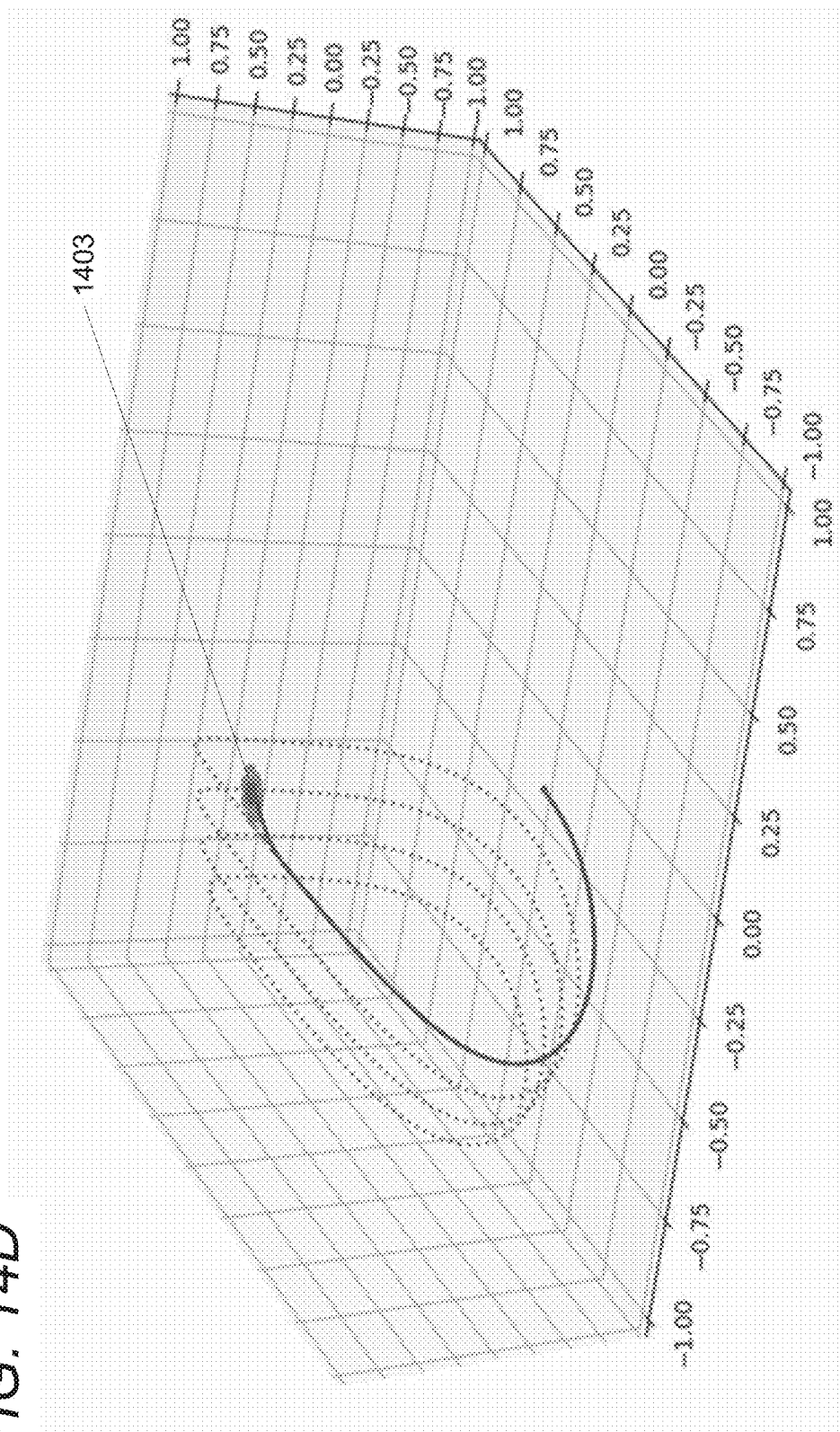

FIGS. 14A-14D conceptually illustrate a comparison of two write methods, including the optimization of magnetic torque, in accordance with various embodiments of the invention. FIG. 14A-14C respectively show the voltage waveform, magnetization, and magnetic torque plots of the two write methods. As shown, lines 1400A, 1400B, and 1400C illustrate the precessional trajectory, where the precession period of the MTJ is 2.3 ns. Lines 1401A, 1401B, and 1401C show a method where the pulse is terminated sharply at the maximum magnetization. Lines 1402A, 1402B, and 1402C show a write method implementing a ramp down period, resulting in lower torque at the maximum magnetization. FIG. 14D shows a 3D visualization of the magnetization. By minimizing torque, the ringing (radius of the circular trajectory 1403 shown in FIG. 14D) can be minimized.

Figure 15:
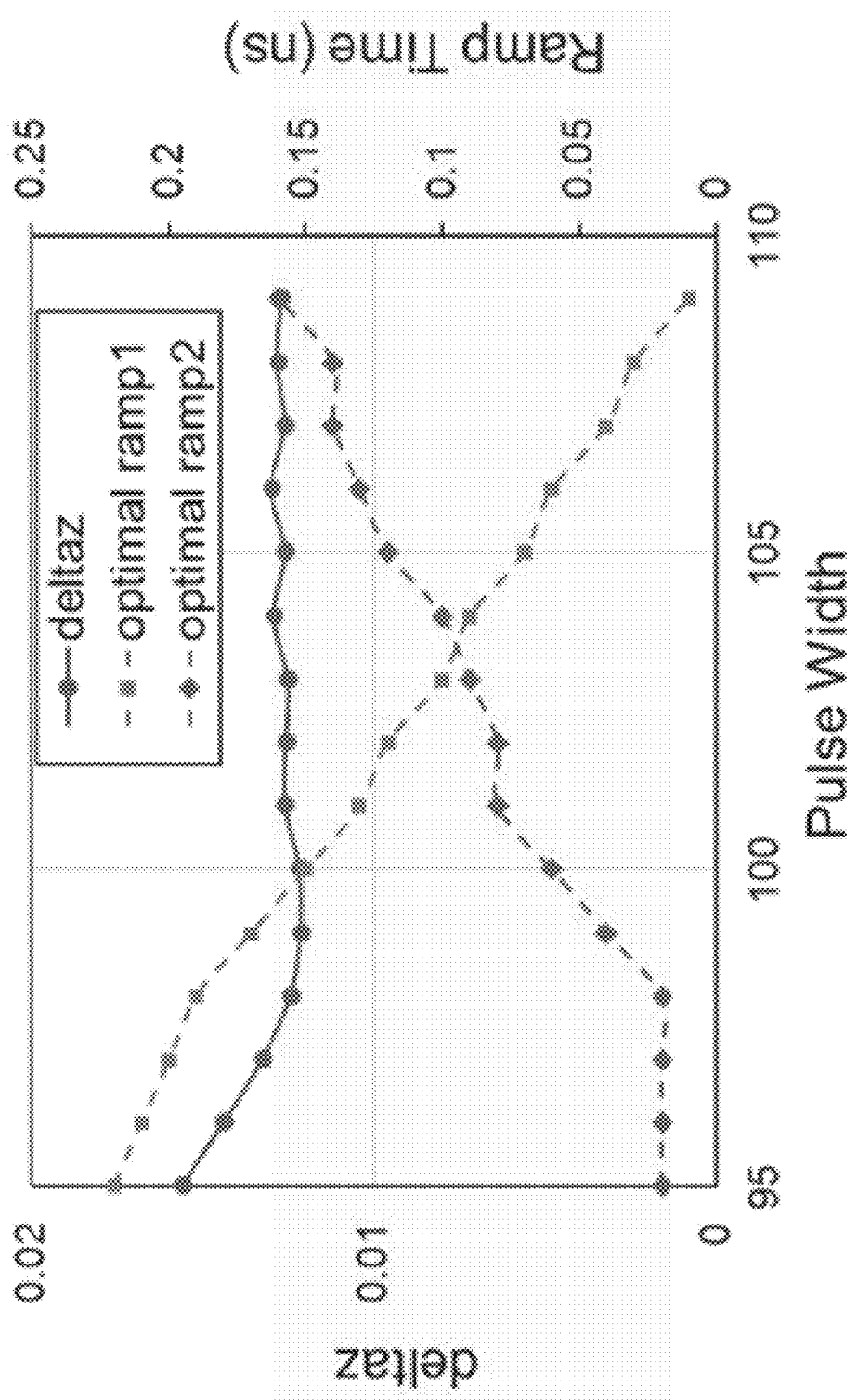
Figures 16A, 16B:
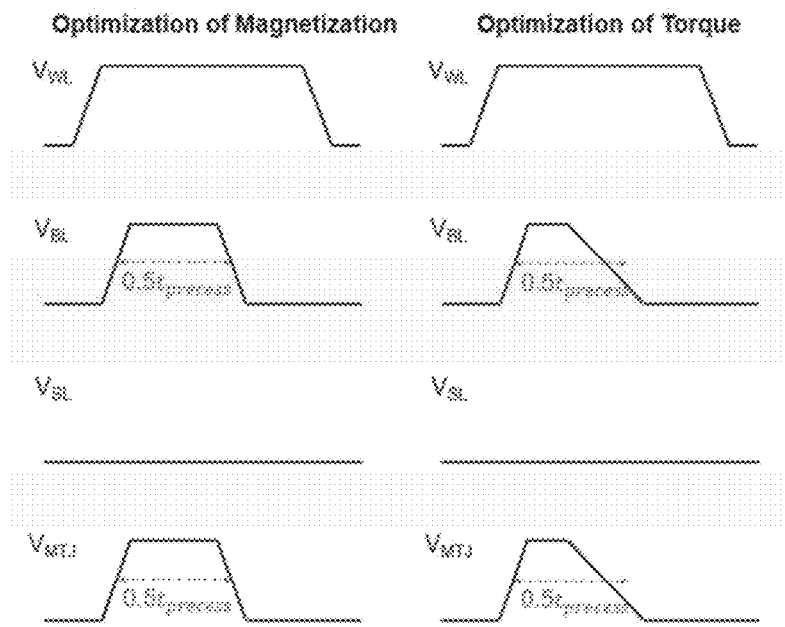
Figures 16C, 16D, 16E:
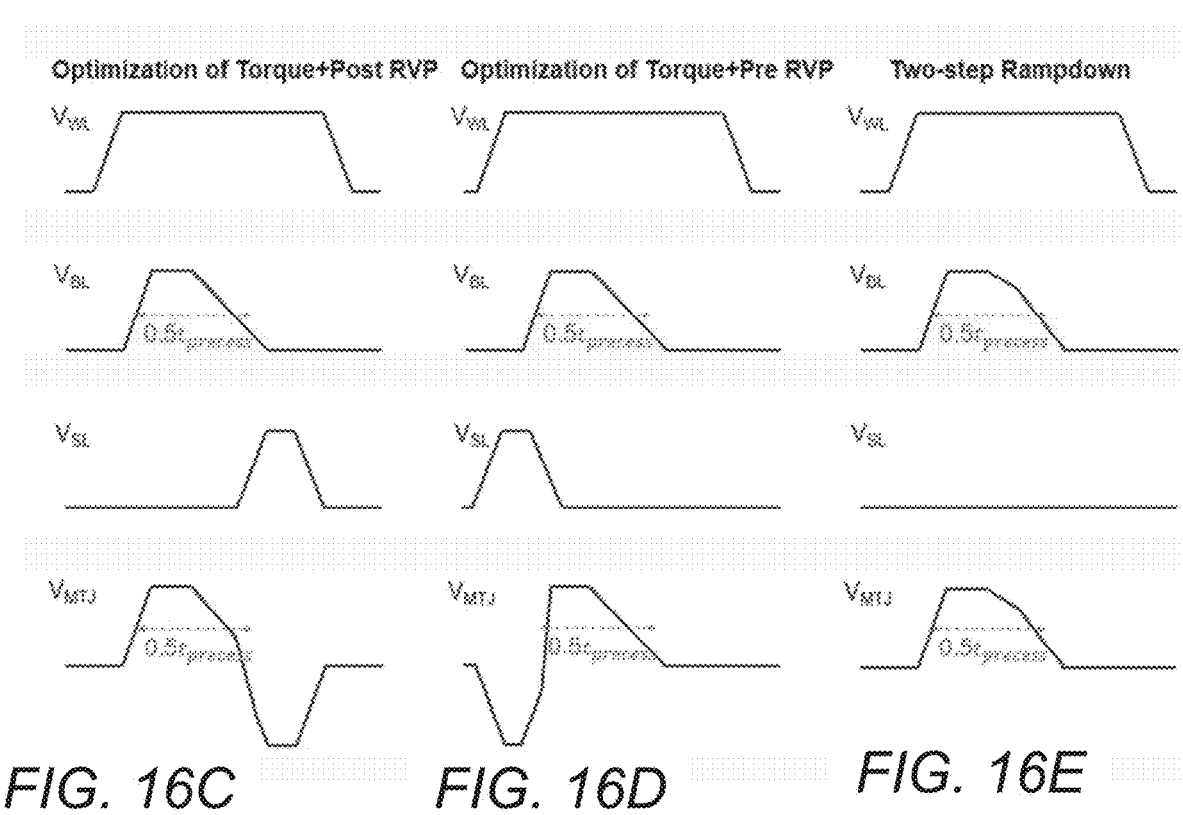

In many embodiments, the magnetic torque can be further optimized by implementing a two-step ramping process instead of only changing the falling edge in a single linear step. In further embodiments, the ramp includes two linear steps. The first linear step can include a ramp from the write voltage to a predetermined voltage (such as 0.6 V in some cases), and the second step can include a ramp from the predetermined voltage to 0V. Two optimized ramps, or steps, for minimal $\Delta m_z$ can be determined for each pulse width. FIG. 15 shows optimal ramps for different pulse widths in accordance with various embodiments of the invention. As shown, $\Delta m_z$ values indicate improvements over single ramp methods.

Although specific methods of implementing optimization of magnetic torque are discussed, many other forms of implementations can be utilized as appropriate to the specific requirements of a given application. For example, in many embodiments, optimization of magnetic torque is implemented using a multi-step ramp, which can include three or more steps. In some embodiments, optimization of magnetic torque is implemented along with a reverse pulse scheme. These and other exemplary forms of implementations are shown in FIGS. 16A-16E. In the illustrative embodiment, a time graph of the voltages $V_{WL}$, $V_{BL}$, $V_{SL}$, and $V_{MTJ}$ are shown for various implementations, including optimization of magnetization (or magnetic trajectory), optimization of magnetic torque, optimization of magnetic torque including a post-RVP scheme, optimization of magnetic torque including a pre-RVP scheme, and optimization of magnetic torque including a two-step rampdown.

Randomness Simulation Applications

As discussed in the sections above, a MeRAM device can operate as a memory device by switching the device using a pulse timed to half of $t_{precess}$. During such operation, the magnetization precesses for half of a cycle, resulting in an inversion of the state of the device. Applying the converse of this principle, a MeRAM device can be configured to operate as a random number generator by applying a long pulse on the device. With a long pulse, damping can cause the magnetism to eventually align with the in-plane axis, leading to the device to be in a metastable state. When the pulse is removed, thermal noise can cause the metastable state to randomly align with one of the two stable states. FIGS. 17A and 17B conceptually illustrate the applications of MeRAM as memory and as a random number generator (RNG) in accordance with various embodiments of the invention. FIG. 17A shows the voltage waveforms for the operation of the two applications, while FIG. 17B shows the Z-magnetization. As shown, the magnetization undergoes a dampened oscillation with a period of $t_{precess}$ when a pulse is applied (solid). In a memory application (dashed), a pulse of half $t_{precess}$ can switch the state of the device. On the other hand, an RNG application (dotted) can be implemented with a long pulse, which can allow the oscillation to dampen and cease. In such cases, the device state is random when the voltage is removed.

Figure 18:
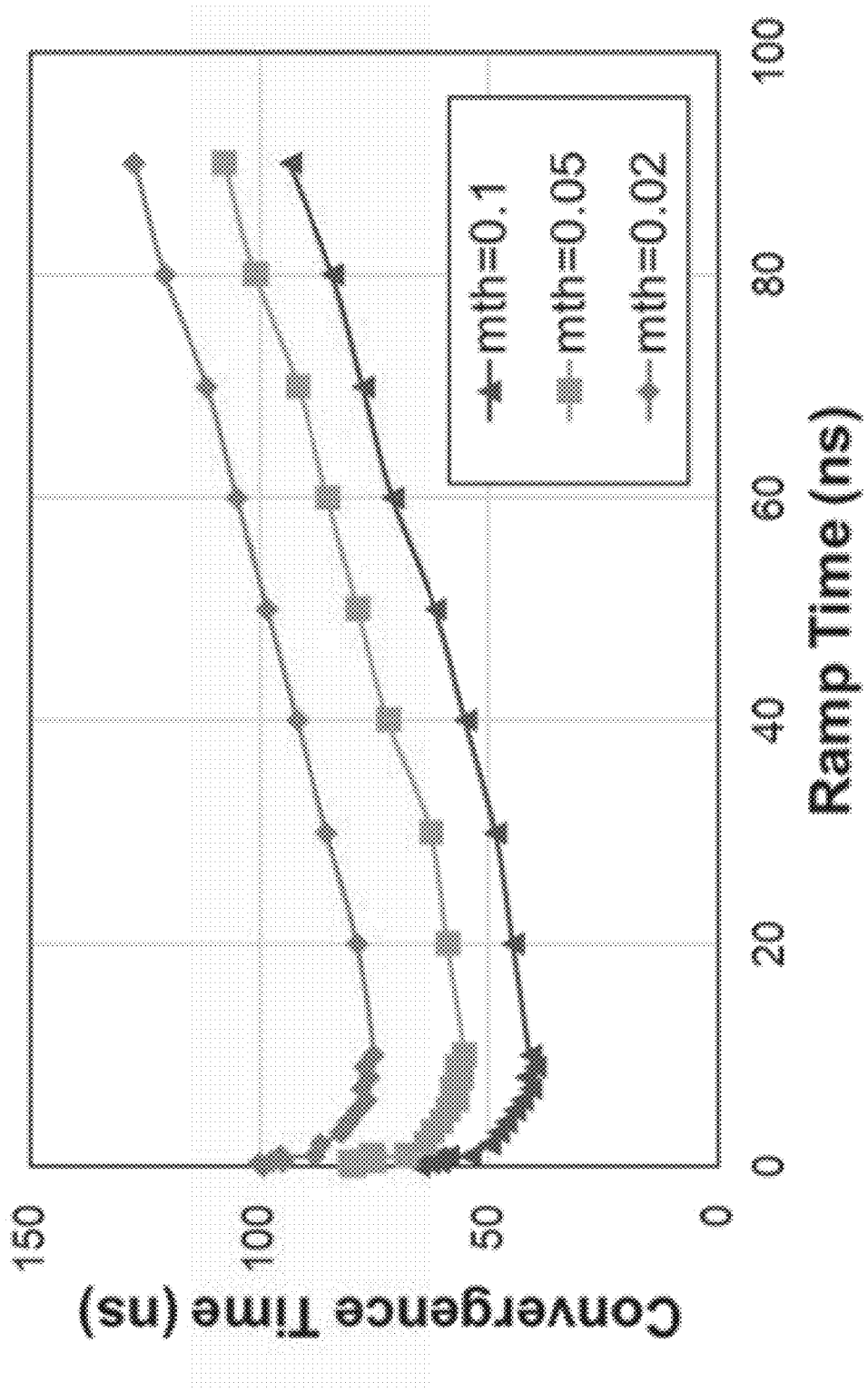

For RNG applications, the time for generating a stochastic bit can depend on the time it takes for the precession amplitude to fall below the noise level. A fast ramp generates a large damping torque, but also creates a large initial torque. A slow ramp reduces the initial torque, but also results in smaller damping torque and additional ramp delay. In many embodiments, a balance between the two effects can be evaluated to determine an optimal convergence time. Convergence time can be defined as the time from the start of the pulse to the time that magnetic oscillation amplitude is below a threshold $m_{th}$. FIG. 18 conceptually illustrates the convergence time for different ramp times and $m_{th}$ of 0.1, 0.05, and 0.02 in accordance with various embodiments of the invention. For $m_{th}=0.1$, the lowest convergence time occurs at ramp time=10 ns, where the convergence time (40 ns) is 25 ns faster than a magnetic trajectory optimization method (65 ns). Furthermore, the energy (87 fJ) is 37% lower than the magnetic trajectory optimization case (139 fJ).

Figure 19A:
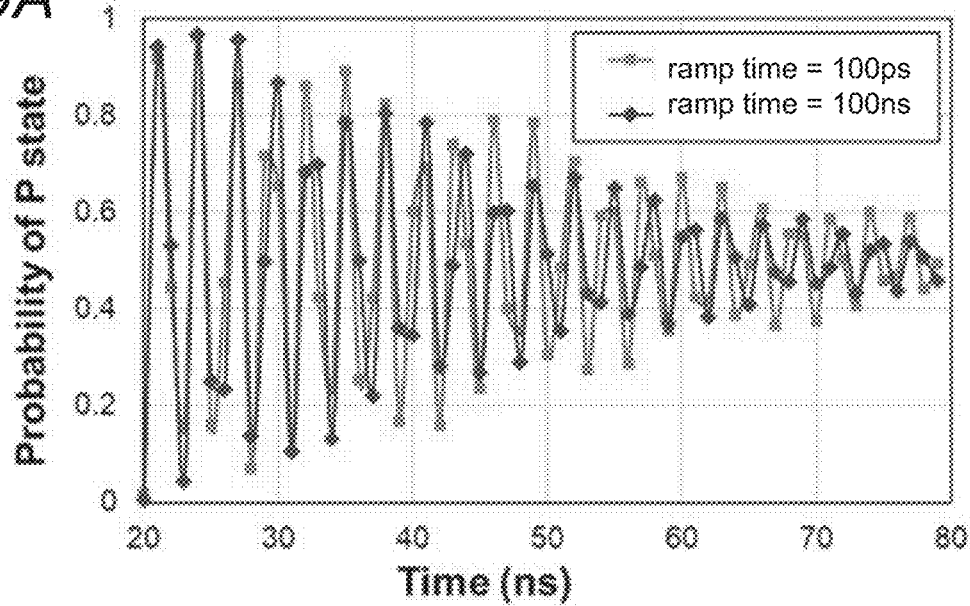
Figure 19B:
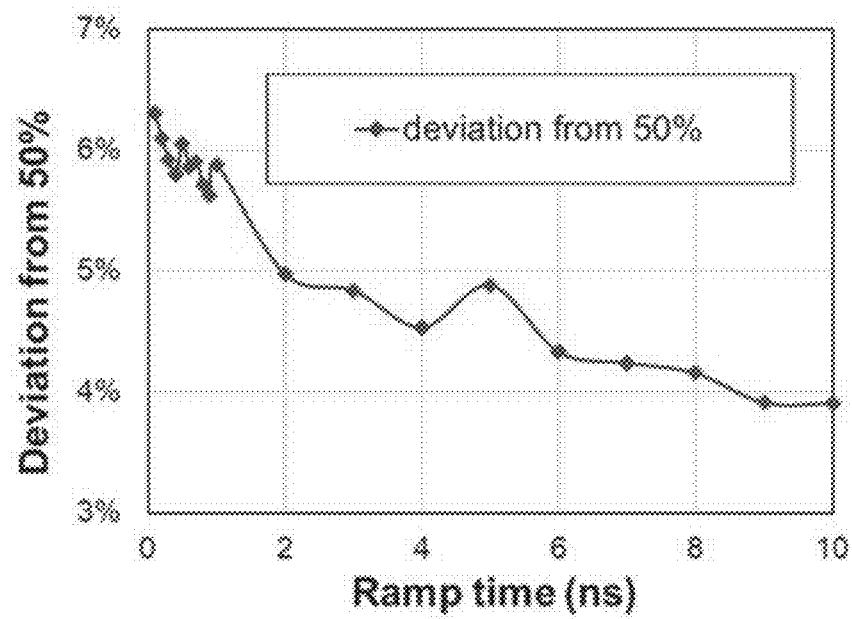

FIG. 19A shows simulations of the probability of P-state as a function of time for the magnetic trajectory optimization (square) vs. magnetic torque optimization (diamond) in accordance with various embodiments of the invention. As shown in FIG. 19A, the probability of the P-state oscillates and eventually converges to near 50%, characteristic of the precessional motion. FIG. 19B shows the difference from ideal RNG (P state probability of 50%) as a function of the ramp time, sampled with a period of 1 ns from pulse width from 70 ns to 80 ns.

Modeling and Simulations

An LLG-based model can be used to evaluate the two methods of optimization, trajectory optimization and torque optimization. FIG. 20 describes the parameters used in the model. For both memory and RNG applications, the performance can be measured by first quantifying deterministically, and then with stochastic simulations. For memory operation, the write error can be quantified by measuring the amount of noise that the device can tolerate at its worst-case condition—i.e., the weakest z-magnetization after the write pulse:

$$\Delta m_z = m_z(t=\inf) - \min(m_z(t=t\text{pulse} \to \inf)$$

Figure 21A:
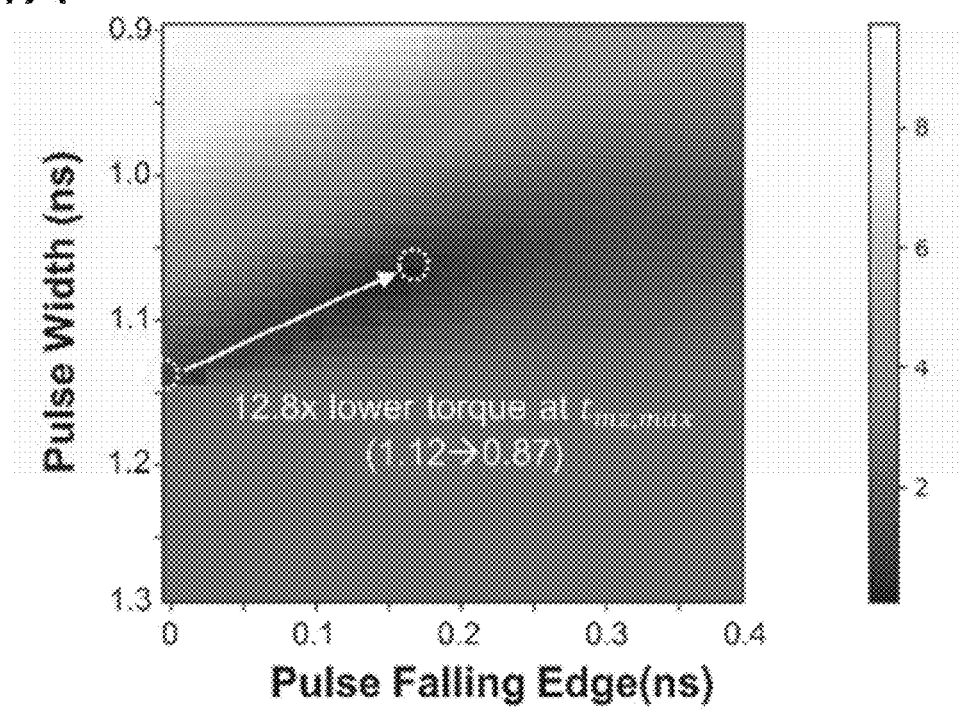
Figure 21B:
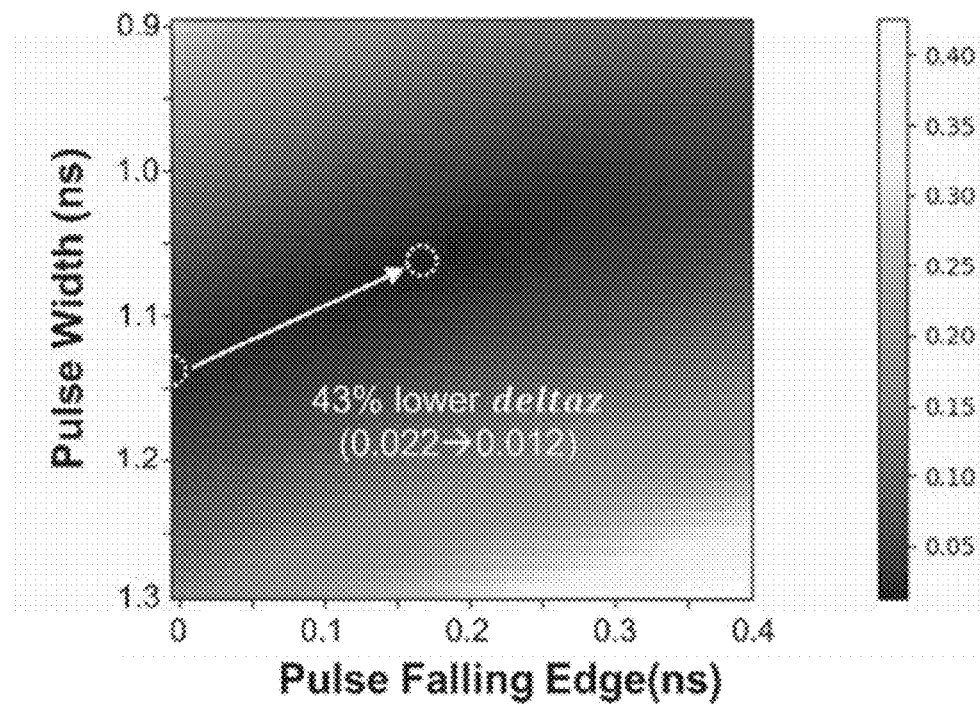

FIG. 21A shows the magnetic torque at $m_{z,max}$ for different pulse-widths and falling edge ramp times in accordance with an embodiment of the invention. As shown, minimizing the torque results in 12.8× lower torque at $m_{z,max}$, compared to the trajectory optimization method. In the illustrative embodiment, the torque is minimized at (pulse width, falling edge)=(1.07 ns, 0.16 ns); while the conventional case is (1.14 ns, 0.01 ns). FIG. 21B shows $\Delta m$, and the corresponding points. As shown, minimizing the torque also minimizes $\Delta m_z$, 43% lower than the write operation for the trajectory optimization method. A linear relation between the pulse width and the ramp time for lowest low plot $\Delta m_z$ can be observed, related to the precessional period of the device.

The WER can then be simulated directly using stochastic LLG equations. FIGS. 22A-22C shows a simulated WER plot and variation tolerance of a device in accordance with an embodiment of the invention. As shown, optimization of torque gives slightly lower error rates (~1.6×), compared to the trajectory optimization method. FIG. 22B shows the amount of variation in the pulse shape that can be tolerated for a given error rate. As shown, the two methods achieve similar tolerance for pulse width (given a fixed ramp time); however, optimization for torque can allow for significantly larger margin (2.1×) for ramp variations.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A method for a writing mechanism for a magnetoelectric random access memory cell, the method comprising:
applying a voltage of a given polarity for a given period of time across a magnetoelectric junction bit of the magnetoelectric random access memory cell, wherein:
the magnetoelectric junction bit comprises:
a ferromagnetic free layer,
a ferromagnetic fixed layer, and
a dielectric layer interposed between the ferromagnetic free layer and the ferromagnetic fixed layer;
application of the voltage of the given polarity across the magnetoelectric junction bit reduces the perpendicular magnetic anisotropy and magnetic coercivity of the ferromagnetic free layer through a voltage controlled magnetic anisotropy effect; and
the magnetization of the ferromagnetic free layer changes direction in response to the application of the voltage of the given polarity for the given period of time; and
lowering the applied voltage of the given polarity before the end of the given period of time, wherein the given period of time is approximately half of a precessional period of the ferromagnetic free layer.

2. The method of claim 1, wherein:
the magnetoelectric random access memory cell comprises:
a first terminal coupled to a bit line,
a second terminal coupled to a source line, and
a third terminal coupled to a word line; and
the magnetoelectric junction bit is coupled to the drain of an MOS transistor.

3. The method of claim 1, further comprising applying a voltage of a polarity opposite the given polarity across the magnetoelectric junction bit at the end of the application of the voltage of the given polarity.

4. The method of claim 2, wherein the voltage of the given polarity is applied using a pulse generator.

5. The method of claim 4, wherein the pulse generator is selected from the group consisting of a bit line driver, a source line driver, and a word line driver.

6. The method of claim 5, wherein:
the rising edge of the application of the voltage of the given polarity decreases the perpendicular magnetic anisotropy and causes a precessional motion of magnetization between two states of the ferromagnetic free layer;
the magnetization direction of the ferromagnetic free layer is different between the two states; and
the falling edge of the application of the voltage of the given polarity restores the decrease in the perpendicular magnetic anisotropy and stops the precessional motion of magnetization.

7. The method of claim 6, further comprising applying a voltage of a polarity opposite the given polarity across the magnetoelectric junction bit at the end of the application of the voltage of the given polarity, wherein the voltage of the polarity opposite the given polarity is applied across the magnetoelectric junction bit subsequent or near simultaneously with the falling edge of the application of the voltage of the given polarity to increase the perpendicular magnetic anisotropy of the ferromagnetic free layer.

8. The method of claim 7, wherein the voltage of the polarity opposite the given polarity is applied using capacitive coupling from the word line to the magnetoelectric junction bit through the gate-to-source-capacitance.

9. The method of claim 7, wherein the voltage of the polarity opposite the given polarity is applied through generating a negative voltage with respect to ground on the bit line while keeping a voltage of the source line at ground level.

10. The method of claim 7, wherein the voltage of the polarity opposite the given polarity is applied by generating a positive voltage pulse on the source line after a write voltage pulse on the bit line.

11. A magnetoelectric random access memory cell comprising:
a magnetoelectric junction bit comprising:
a ferromagnetic free layer;
a ferromagnetic fixed layer; and
a dielectric layer interposed between the ferromagnetic free layer and the ferromagnetic fixed layer;
wherein the magnetoelectric junction bit is configured such that when a voltage of a given polarity is applied across the magnetoelectric junction bit for half a precessional period of the ferromagnetic free layer, the perpendicular magnetic anisotropy and magnetic coercivity of the ferromagnetic free layer are reduced through a voltage controlled magnetic anisotropy effect and the magnetization of the ferromagnetic free layer changes direction; and
wherein the magnetoelectric junction bit is configured such that when the applied voltage of the given polarity is reduced before the end of the half precessional period of the ferromagnetic free layer, a magnetic torque of the ferromagnetic free layer is reduced before a maximum magnetic trajectory of the ferromagnetic free layer is reached.

12. The magnetoelectric random access memory cell of claim 11, further comprising:
a first terminal coupled to a bit line;
a second terminal coupled to a source line; and
a third terminal coupled to a word line.

13. The magnetoelectric random access memory cell of claim 12, wherein the magnetoelectric junction bit is coupled to the drain of an MOS transistor.

14. The magnetoelectric random access memory cell of claim 13, wherein the voltage of the given polarity is applied using a pulse generator.

15. The magnetoelectric random access memory cell of claim 14, wherein the pulse generator is selected from the group consisting of a bit line driver, a source line driver, and a word line driver.

16. The magnetoelectric random access memory cell of claim 15, wherein:
the rising edge of the application of the voltage of the given polarity decreases the perpendicular magnetic anisotropy and causes a precessional motion of magnetization between two states of the ferromagnetic free layer, wherein the magnetization direction of the ferromagnetic free layer is different between the two states; and the falling edge of the application of the voltage of the given polarity restores the decrease in the perpendicular magnetic anisotropy and stops the precessional motion of magnetization.

17. The magnetoelectric random access memory cell of claim 16, wherein a voltage of the polarity opposite the given polarity is applied across the magnetoelectric junction bit subsequent or near simultaneously with the falling edge of the application of the voltage of the given polarity to increase the perpendicular magnetic anisotropy of the ferromagnetic free layer.

18. The magnetoelectric random access memory cell of claim 17, wherein the voltage of the polarity opposite the given polarity is applied using capacitive coupling from the word line to the magnetoelectric junction bit through the gate-to-source-capacitance.

19. The magnetoelectric random access memory cell of claim 17, wherein the voltage of the polarity opposite the given polarity is applied through generating a negative voltage with respect to ground on the bit line while keeping a voltage of the source line at ground level.

20. The magnetoelectric random access memory cell of claim 17, wherein the voltage of the polarity opposite the given polarity is applied by generating a positive voltage pulse on the source line after a write voltage pulse on the bit line.

* * * * *